(12) United States Patent
Utsumi

(10) Patent No.: US 11,769,808 B2
(45) Date of Patent: Sep. 26, 2023

(54) SEMICONDUCTOR MEMORY DEVICE

(71) Applicant: Kioxia Corporation, Tokyo (JP)

(72) Inventor: Tetsuaki Utsumi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 70 days.

(21) Appl. No.: 17/374,475

(22) Filed: Jul. 13, 2021

(65) Prior Publication Data

US 2021/0343848 A1 Nov. 4, 2021

Related U.S. Application Data

(63) Continuation of application No. 17/013,286, filed on Sep. 4, 2020, now Pat. No. 11,121,227.

(30) Foreign Application Priority Data

Sep. 25, 2019 (JP) ................................. 2019-173815

(51) Int. Cl.
*H01L 29/423* (2006.01)

(52) U.S. Cl.
CPC .... *H01L 29/42324* (2013.01); *H01L 29/4234* (2013.01)

(58) Field of Classification Search
CPC ....................... H01L 29/42324; H01L 29/4234
See application file for complete search history.

(56) References Cited

U.S. PATENT DOCUMENTS

| 9,818,693 | B2 | 11/2017 | Toyama et al. |
| 10,068,647 | B2 | 9/2018 | Okda et al. |
| 10,276,585 | B2 | 4/2019 | Utsumi |
| 2018/0233185 | A1 | 8/2018 | Futatsuyama |
| 2019/0019723 | A1* | 1/2019 | Miyano ................. H10B 43/35 |
| 2019/0043874 | A1 | 2/2019 | Thimmegowda et al. |
| 2020/0126622 | A1* | 4/2020 | Utsumi ................. H10B 43/40 |

FOREIGN PATENT DOCUMENTS

JP 2018-26518 A 2/2018

* cited by examiner

*Primary Examiner* — Wasiul Haider
(74) *Attorney, Agent, or Firm* — Oblon, McClelland, Maier & Neustadt, L.L.P.

(57) ABSTRACT

A semiconductor memory device includes: a semiconductor substrate; a memory cell array disposed separately from the semiconductor substrate in a first direction; and first and second transistor arrays disposed on the semiconductor substrate. The semiconductor substrate includes a first region to a fourth region arranged in a second direction and a fifth region to an eighth region arranged in the second direction. These regions are each adjacent in a third direction. The memory cell array includes first conducting layers disposed in the first to fourth regions and second conducting layers disposed in the fifth to eighth regions. The first transistor array includes transistors connected to the plurality of first conducting layers via contacts disposed in the second region. The second transistor array includes transistors connected to the plurality of second conducting layers via contacts disposed in the seventh region.

16 Claims, 37 Drawing Sheets

SEMICONDUCTOR MEMORY DEVICE

CROSS-REFERENCE TO RELATED APPLICATIONS

This application is a continuation of U.S. application Ser. No. 17/013,286, filed Sep. 4, 2020, which is based upon and claims the benefit of Japanese Patent Application No. 2019-173815, filed on Sep. 25, 2019, the entire contents of which are incorporated herein by reference.

BACKGROUND

Field

Embodiments described herein relate generally to a semiconductor memory device.

Description of the Related Art

There has been known a semiconductor memory device that includes a memory cell array disposed separately from a semiconductor substrate in a direction intersecting with a surface of the semiconductor substrate and transistor arrays disposed on the surface of the semiconductor substrate.

DETAILED DESCRIPTION

Figure 1:
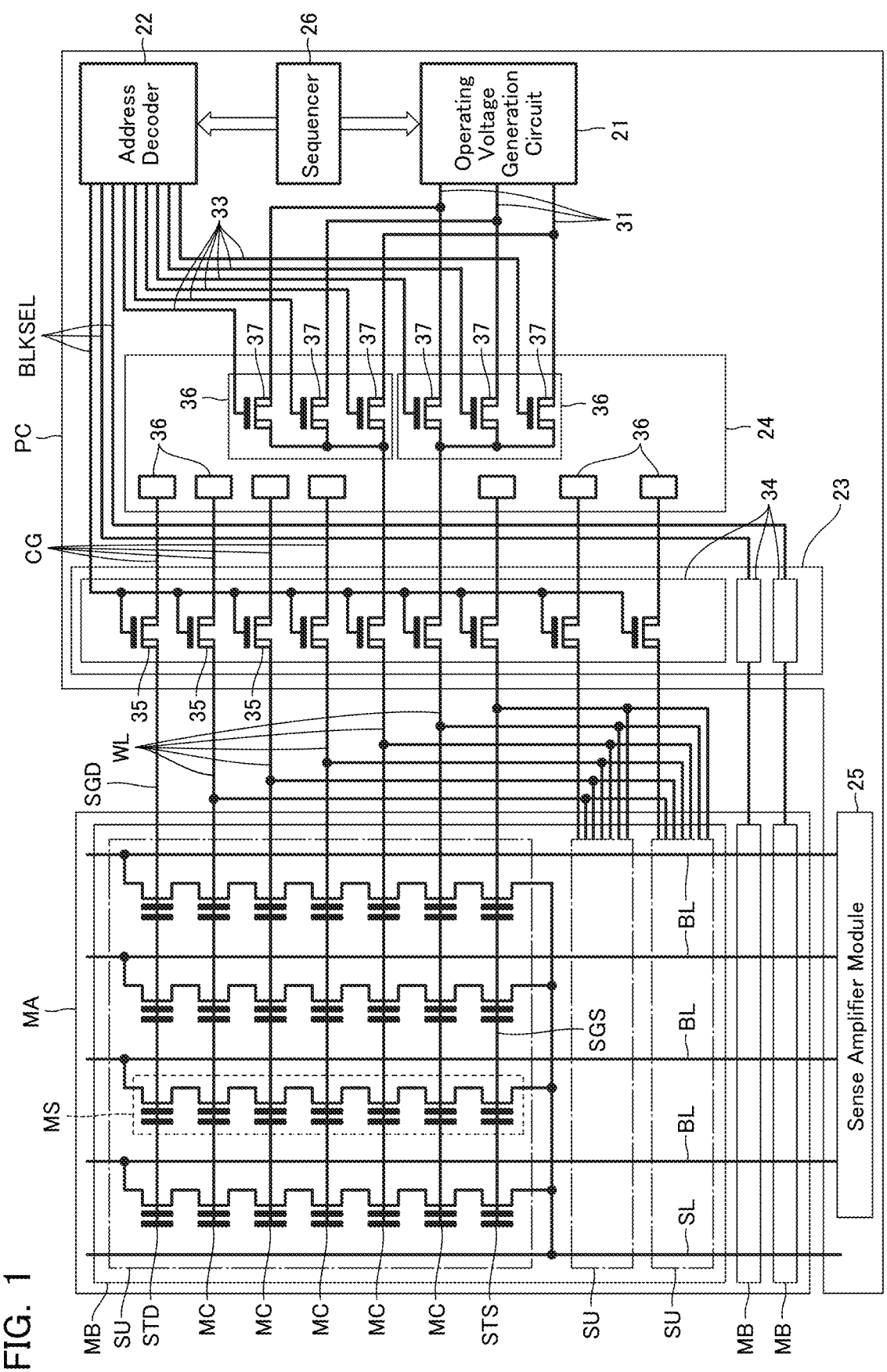
FIG. 1 is an equivalent circuit diagram illustrating a schematic configuration of a semiconductor memory device according to a first embodiment.

According to one embodiment, a semiconductor memory device comprises: a semiconductor substrate; a memory cell array disposed separately from the semiconductor substrate in a first direction intersecting with a surface of the semiconductor substrate; and a first transistor array and a second transistor array disposed on the semiconductor substrate.

The semiconductor substrate includes a first region to a fourth region arranged in order in a second direction intersecting with the first direction and a fifth region to an eighth region arranged in order in the second direction. In a third direction intersecting with the first direction and the second direction, the fifth region is adjacent to the first region, the sixth region is adjacent to the second region, the seventh region is adjacent to the third region, and the eighth region is adjacent to the fourth region.

The memory cell array includes: a plurality of first conducting layers extending in the second direction in the first region to the fourth region and laminated in the first direction; a plurality of first semiconductor columns disposed in the first region, the plurality of first semiconductor columns extending in the first direction and being opposed to the plurality of first conducting layers; a plurality of first connection contacts disposed in the second region, the plurality of first connection contacts extending in the first direction and being connected to the plurality of respective first conducting layers at one ends in the first direction; and a plurality of second semiconductor columns disposed in the fourth region, the plurality of second semiconductor columns extending in the first direction and being opposed to the plurality of first conducting layers.

The memory cell array includes: a plurality of second conducting layers extending in the second direction in the fifth region to the eighth region and laminated in the first direction; a plurality of third semiconductor columns disposed in the fifth region, the plurality of third semiconductor columns extending in the first direction and being opposed to the plurality of second conducting layers; a plurality of second connection contacts disposed in the seventh region, the plurality of second connection contacts extending in the first direction and being connected to the plurality of respective second conducting layers at one ends in the first direction; and a plurality of fourth semiconductor columns disposed in the eighth region, the plurality of fourth semiconductor columns extending in the first direction and being opposed to the plurality of second conducting layers.

The first transistor array is disposed in a region including the second region and the sixth region. The first transistor array includes a plurality of first transistors arranged in the second direction and a plurality of second transistors arranged in the second direction. The plurality of second transistors are adjacent to the plurality of first transistors in the third direction via insulating regions disposed on the surface of the semiconductor substrate. The plurality of first transistors and the plurality of second transistors are connected to the plurality of first conducting layers via the plurality of first connection contacts.

The second transistor array is disposed in a region including the third region and the seventh region. The first transistor array includes a plurality of third transistors arranged in the second direction and a plurality of fourth transistors arranged in the second direction. The plurality of third transistors are adjacent to the plurality of fourth transistors in the third direction via the insulating regions. The plurality of third transistors and the plurality of fourth transistors are connected to the plurality of second conducting layers via the plurality of second connection contacts.

Next, a semiconductor memory device according to embodiments will be described in detail with reference to the drawings. The following embodiments are only examples, and not described for the purpose of limiting the present invention.

In this specification, a predetermined direction parallel to a surface of the semiconductor substrate is referred to as an X-direction, a direction parallel to the surface of the semiconductor substrate and perpendicular to the X-direction is referred to as a Y-direction, and a direction perpendicular to the surface of the semiconductor substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction or does not have to correspond to these directions.

Expressions such as "above" and "below" in this specification are based on the semiconductor substrate. For example, a direction away from the semiconductor substrate along the Z-direction is referred to as above and a direction approaching the semiconductor substrate along the Z-direction is referred to as below. A lower surface and a lower end portion of a certain configuration mean a surface and an end portion on the semiconductor substrate side of this configuration. An upper surface and an upper end portion of a certain configuration mean a surface and an end portion on a side opposite to the semiconductor substrate of this configuration. A surface intersecting with the X-direction or the Y-direction is referred to as a side surface and the like.

In this specification, when referring to that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is disposed on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Overall Configuration]

Next, with reference to drawings, a configuration of a semiconductor memory device according to a first embodiment will be described. The following drawings are schematic, and for convenience of description, a part of configurations is sometimes omitted.

FIG. 1 is a schematic equivalent circuit diagram illustrating a configuration of a semiconductor memory device according to the first embodiment.

The semiconductor memory device according to the embodiment includes a memory cell array MA and a peripheral circuit PC controlling the memory cell array MA.

The memory cell array MA includes a plurality of memory blocks MB. The plurality of memory blocks MB each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain select transistor STD, a plurality of memory cells MC, and a source select transistor STS, which are connected in series between the bit lines BL and the source line SL. Hereinafter, the drain select transistor STD and the source select transistor STS may be simply referred to as select transistors (STD, STS).

The memory cell MC according to the embodiment is a field-effect type transistor that includes electric charge accumulating films in gate insulating films. The memory cell MC has a threshold voltage that varies according to an electric charge amount in the electric charge accumulating film. Word lines WL are connected to respective gate electrodes of the plurality of memory cells MC corresponding to one memory string MS. These respective word lines WL are connected to all of the memory strings MS in one memory block MB in common.

The select transistors (STD, STS) are field-effect type transistors. Selection gate lines (SGD, SGS) are connected to respective gate electrodes of the select transistors (STD, STS). Drain select line SGD is disposed corresponding to the string unit SU and connected to all of the memory strings MS in one string unit SU in common. Source select line SGS is connected to all of the memory strings MS in one memory block MB in common.

The peripheral circuit PC includes an operating voltage generation circuit 21 that generates operating voltages, an address decoder 22 that decodes address data, a block select circuit 23 and a voltage select circuit 24 that transfer the operating voltage to the memory cell array MA according to an output signal of the address decoder 22, a sense amplifier module 25 connected to the bit lines BL, and a sequencer 26 that controls them.

The operating voltage generation circuit 21 includes a plurality of operating voltage output terminals 31. The operating voltage generation circuit 21 includes, for example, a step down circuit, such as a regulator, and a step up circuit, such as a charge pump circuit. The operating voltage generation circuit 21, for example, generates a plurality of patterns of operating voltages applied to the bit line BL, the source line SL, the word line WL, and the select gate lines (SGD, SGS) in a read operation, a write operation, and an erase operation for the memory cell array MA, in response to a control signal from the sequencer 26 to simultaneously output the operating voltages to the plurality of operating voltage output terminals 31. The operating voltage output from the operating voltage output terminal 31 is appropriately adjusted in accordance with the control signal from the sequencer 26.

The address decoder 22 includes a plurality of block select lines BLKSEL and a plurality of voltage select lines 33. For example, the address decoder 22 sequentially refers to address data of an address register in response to the control signal from the sequencer 26, decodes this address data to cause a block driving transistor 35 and a voltage select transistor 37 corresponding to the address data to be in a state of ON, and cause the block driving transistor 35 and the voltage select transistor 37 other than the above to be in a state of OFF. For example, voltages of the block select line BLKSEL and the voltage select line 33 corresponding to the address data are set to be in a state of "H" and a voltage other than that is set to be in a state of "L." When a P channel type transistor is used, not an N channel type transistor, an inverse voltage is applied to these wirings.

In the illustrated example, in the address decoder 22, one block select line BLKSEL is disposed per memory block MB. However, this configuration is appropriately changeable. For example, one block select line BLKSEL may be included per two or more memory blocks MB.

The block select circuit 23 includes a plurality of block selectors 34 that correspond to the memory blocks MB. The plurality of block selectors 34 each include a plurality of block driving transistors 35 corresponding to the word lines WL and the select gate lines (SGD, SGS). The block driving transistor 35 is, for example, a field-effect type high voltage transistor. The block driving transistors 35 have drain electrodes each electrically connected to the corresponding word line WL or select gate line (SGD, SGS). The source electrodes are each electrically connected to the operating voltage output terminal 31 via a wiring CG and the voltage select circuit 24. The gate electrodes are commonly connected to the corresponding block select line BLKSEL.

Note that the block select circuit 23 further includes a plurality of transistors (not illustrated). The plurality of transistors are field-effect type high voltage transistors connected between the select gate lines (SGD, SGS) and ground voltage supply terminals. The plurality of transistors electrically conduct the select gate lines (SGD, SGS) included in the non-selected memory blocks MB with the ground voltage supply terminals. Note that the plurality of word lines WL included in the non-selected memory blocks MB enter a floating state.

The voltage select circuit 24 includes a plurality of voltage selectors 36 corresponding to the word lines WL and the select gate lines (SGD, SGS). The plurality of voltage selectors 36 each includes a plurality of voltage select transistors 37. The voltage select transistor 37 is, for example, a field-effect type high voltage transistor. The voltage select transistors 37 have drain terminals that are each electrically connected to the corresponding word line WL or the select gate line (SGD, SGS) via the wiring CG and the block select circuit 23. The source terminals are each electrically connected to the corresponding operating voltage output terminal 31. The gate electrodes are each connected to the corresponding voltage select line 33.

The sense amplifier module 25 is connected to the plurality of bit lines BL. The sense amplifier module 25 includes, for example, a plurality of sense amplifier units corresponding to the bit lines BL. The sense amplifier units each include a clamp transistor that charges the bit line BL based on the voltage generated in the operating voltage generation circuit 21, a sense transistor that senses the voltage or a current of the bit line BL, a plurality of latch circuits that latch output signals, write data, and the like of this sense transistor.

The sequencer 26 outputs the control signal to the operating voltage generation circuit 21, the address decoder 22, and the sense amplifier module 25, according to an input instruction and a state of the semiconductor memory device. For example, the sequencer 26 sequentially refers to command data of a command register in response to a clock signal, decodes this command data, and outputs it to the operating voltage generation circuit 21, the address decoder 22, and the sense amplifier module 25.

Figure 2:
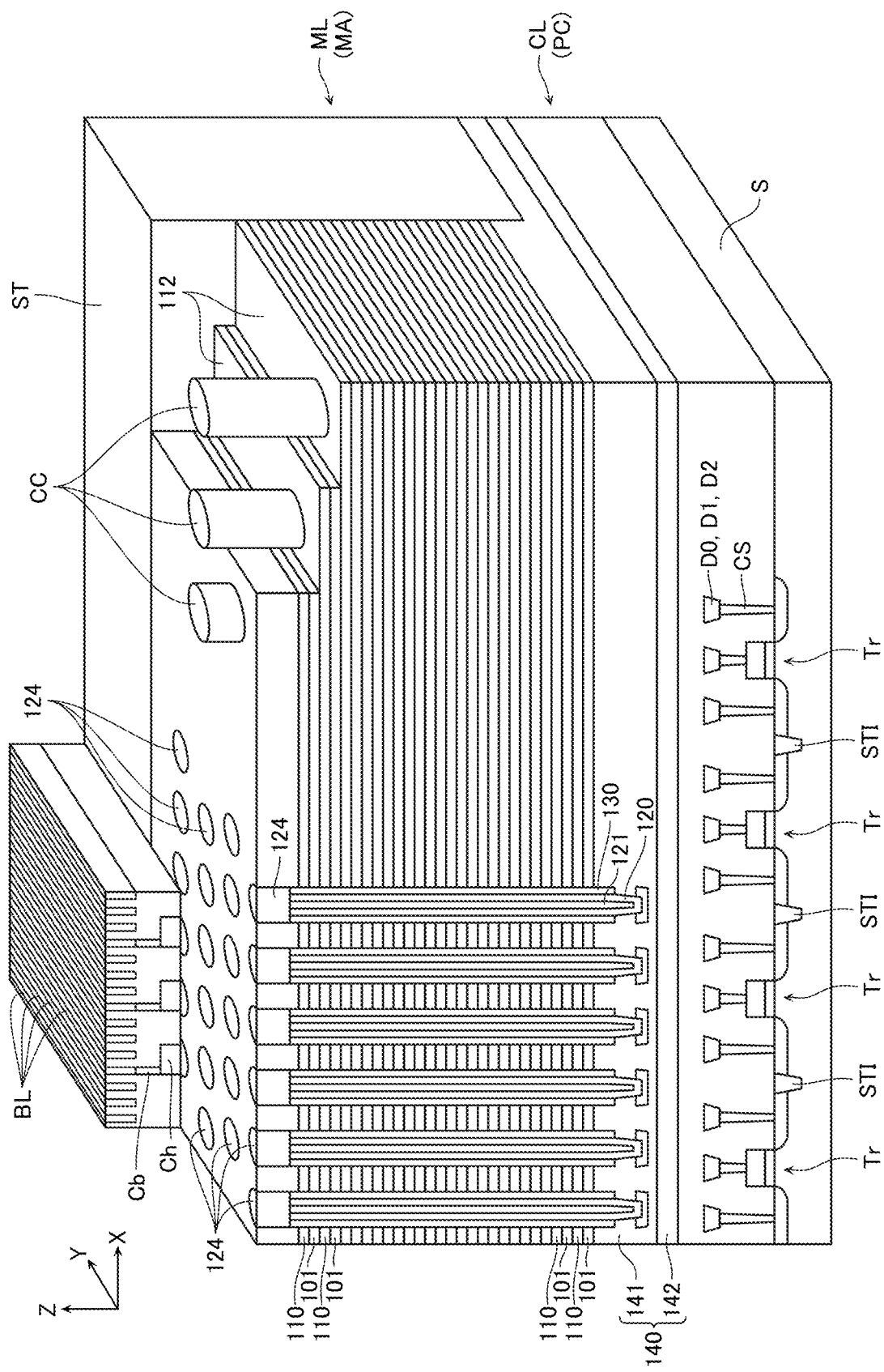
FIG. 2 is a schematic perspective view of the semiconductor memory device.

FIG. 2 is a schematic perspective view of the semiconductor memory device according to the embodiment. Note that FIG. 2 shows a schematic structure for description and does not illustrate a detailed location and the like of each configuration. More specific location and the like of each configuration will be described later with reference to FIG. 4 to FIG. 11.

As illustrated in FIG. 2, the semiconductor memory device according to the embodiment includes a semiconductor substrate S, a circuit layer CL disposed on the semiconductor substrate S, and a memory layer ML disposed above the circuit layer CL.

The semiconductor substrate S is a semiconductor substrate made of, for example, single-crystal silicon (Si). The semiconductor substrate S has a double well structure that includes, for example, an N-type well on a surface of a P-type semiconductor substrate and further a P-type well in this N-type well. The semiconductor substrate S includes insulating layers STI, such as silicon oxide ($SiO_2$).

The circuit layer CL includes a plurality of transistors Tr constituting the peripheral circuit PC (FIG. 1) and a plurality of wirings D0, D1, D2 and contacts CS connected to the plurality of transistors Tr. The transistor Tr is, for example, a field-effect type transistor using the surface of the semiconductor substrate S as a channel region (gate region). In the surface of the semiconductor substrate S, regions that function as a part of the transistors Tr are surrounded by the insulating layers STI.

The memory layer ML includes a plurality of configurations included in the memory cell array MA. The memory layer ML includes a plurality of conducting layers 110 arranged in the Z-direction, semiconductor columns 120 extending in the Z-direction and opposed to the plurality of conducting layers 110, gate insulating films 130 disposed between the plurality of conducting layers 110 and the semiconductor columns 120, and a conducting layer 140 connected to the lower ends of the semiconductor columns 120.

The conducting layer 110 is an approximately plate-shaped conducting layer extending in the X-direction. The plurality of conducting layers 110 are arranged in the Z-direction. The conducting layer 110 may include, for example, a laminated film or the like of titanium nitride (TiN) and tungsten (W) or may contain polycrystalline silicon or the like containing impurities of phosphorus, boron, or the like. An insulating layer 101 of silicon oxide ($SiO_2$) or the like is disposed between the conducting layers 110.

Among the plurality of conducting layers 110, one or a plurality of conducting layers 110 positioned at the bottom function as the source select line SGS (FIG. 1) and the gate electrodes of the plurality of source select transistors STS (FIG. 1) connected to this source select line SGS. The plurality of conducting layers 110 positioned above this function as the word lines WL (FIG. 1) and the gate electrodes of the plurality of memory cells MC (FIG. 1) connected to the word lines WL. One or a plurality of conducting layers 110 positioned above this function as the drain select line SGD (FIG. 1) and the gate electrodes of the plurality of drain select transistors STD (FIG. 1) connected to this drain select line SGD.

The plurality of semiconductor columns 120 are installed in the X-direction and the Y-direction. The semiconductor column 120 is, for example, a semiconductor layer of, for example, non-doped polycrystalline silicon (Si). The semiconductor column 120 has an approximately cylindrical shape and includes an insulating layer 121 of silicon oxide or the like at the center part. Respective outer peripheral surfaces of the semiconductor columns 120 are surrounded by the conducting layers 110. The semiconductor column 120 has a lower end portion connected to the conducting layer 140. The semiconductor column 120 has an upper end portion connected to the bit line BL extending in the Y-direction via a semiconductor layer 124 containing N-type impurities of phosphorus (P) or the like and contacts Ch and Cb. The respective semiconductor columns 120 function as channel regions of the plurality of memory cells MC and the select transistors (STD, STS) included in one memory string MS (FIG. 1).

Figure 3:
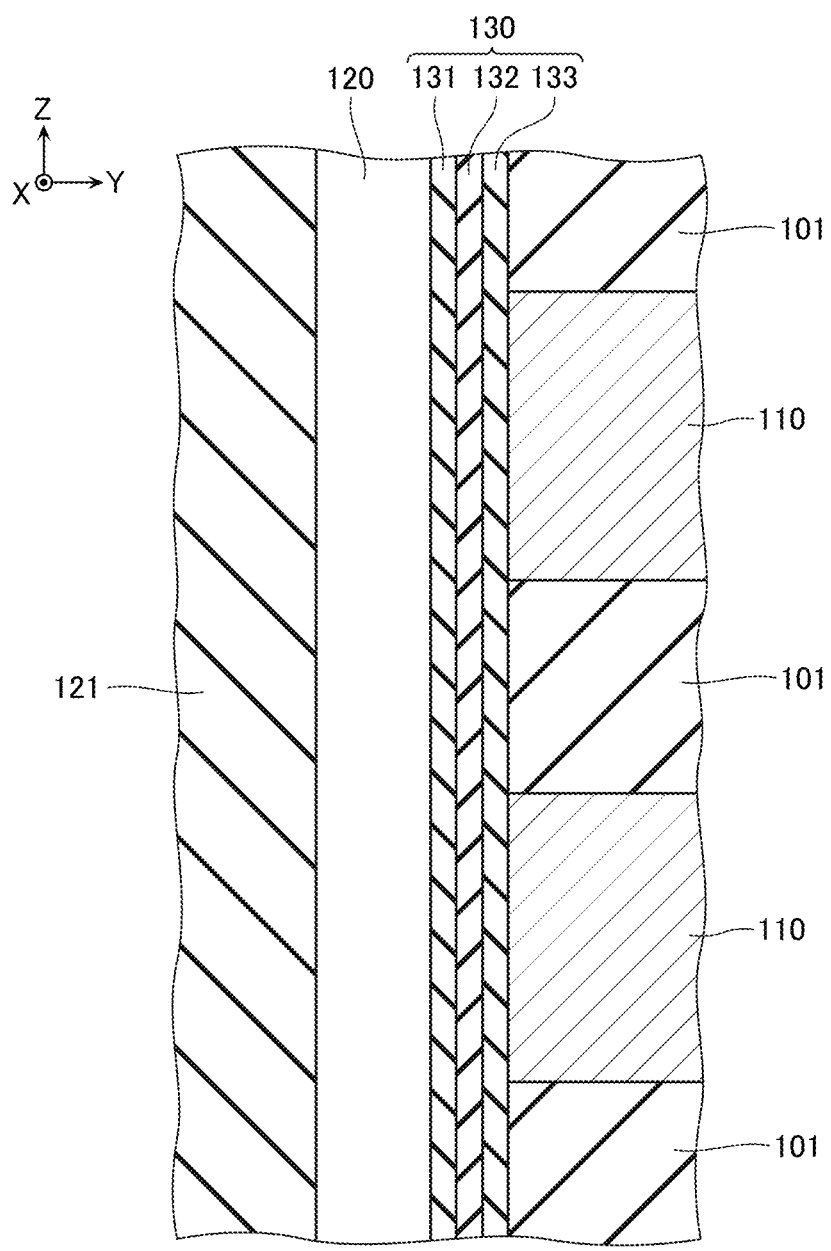
FIG. 3 is a schematic enlarged view of FIG. 2.

The gate insulating film 130 includes, for example, as illustrated in FIG. 3, a tunnel insulating film 131, an electric charge accumulating film 132, and a block insulating film 133, which are laminated between the semiconductor column 120 and the conducting layers 110. The tunnel insulating film 131 and the block insulating film 133 are, for example, insulating films of silicon oxide or the like. The electric charge accumulating film 132 is a film that can accumulate an electric charge, such as, silicon nitride (SiN) or the like. The tunnel insulating film 131, the electric charge accumulating film 132, and the block insulating film 133, which have approximately cylindrical shapes, extend in the Z-direction along the outer peripheral surface of the semiconductor column 120.

FIG. 3 illustrates an example that the gate insulating film 130 includes the electric charge accumulating film 132 of silicon nitride or the like. However, the gate insulating film 130 may include, for example, a floating gate of polycrystalline silicon containing N-type or P-type impurities or the like.

For example, as illustrated in FIG. 2, the conducting layer 140 includes a conducting film 141 connected to the lower end portions of the semiconductor columns 120 and a conducting film 142 disposed on the lower surface of the conducting film 141. The conducting film 141 contains, for example, a semiconductor having a conductive property such as polysilicon containing N-type impurities, such as phosphorus (P). The conducting film 142 may contain, for example, a semiconductor having a conductive property such as polysilicon containing N-type impurities, such as phosphorus (P), may contain a metal, such as tungsten (W), or may contain silicide or the like.

Next, with reference to FIG. 4 to FIG. 11, the semiconductor memory device according to the embodiment will be described in more detail. Note that FIG. 4 to FIG. 11 illustrate schematic configurations, and the specific configurations are appropriately changeable. For convenience of description, FIG. 4 to FIG. 11 omit apart of configurations.

[Memory Layer ML]

Figure 4:
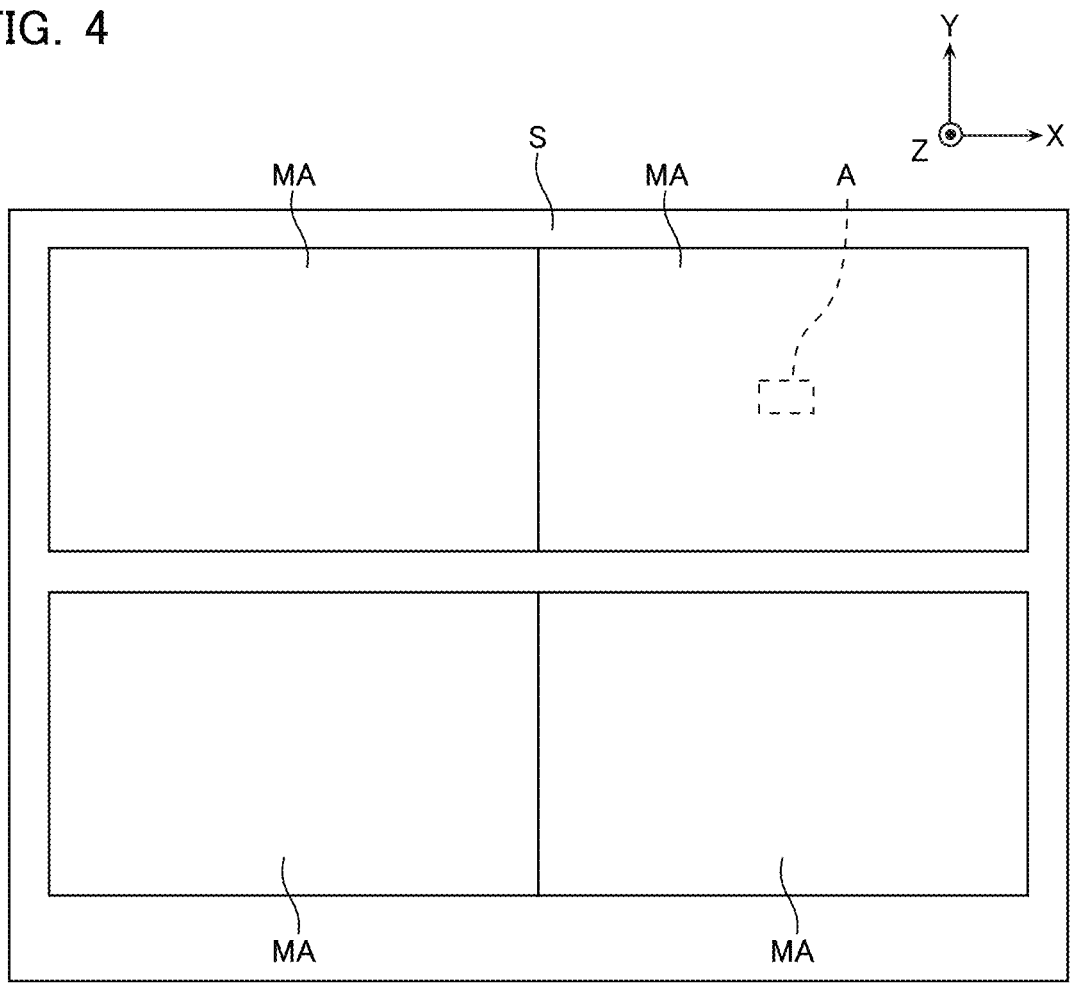
FIG. 4 is a schematic plan view of the semiconductor memory device.

FIG. 4 is a schematic plan view of the semiconductor memory device according to the embodiment. In the example of FIG. 4, the semiconductor substrate S includes the four memory cell arrays MA arranged in the X-direction and the Y-direction.

Figure 5:
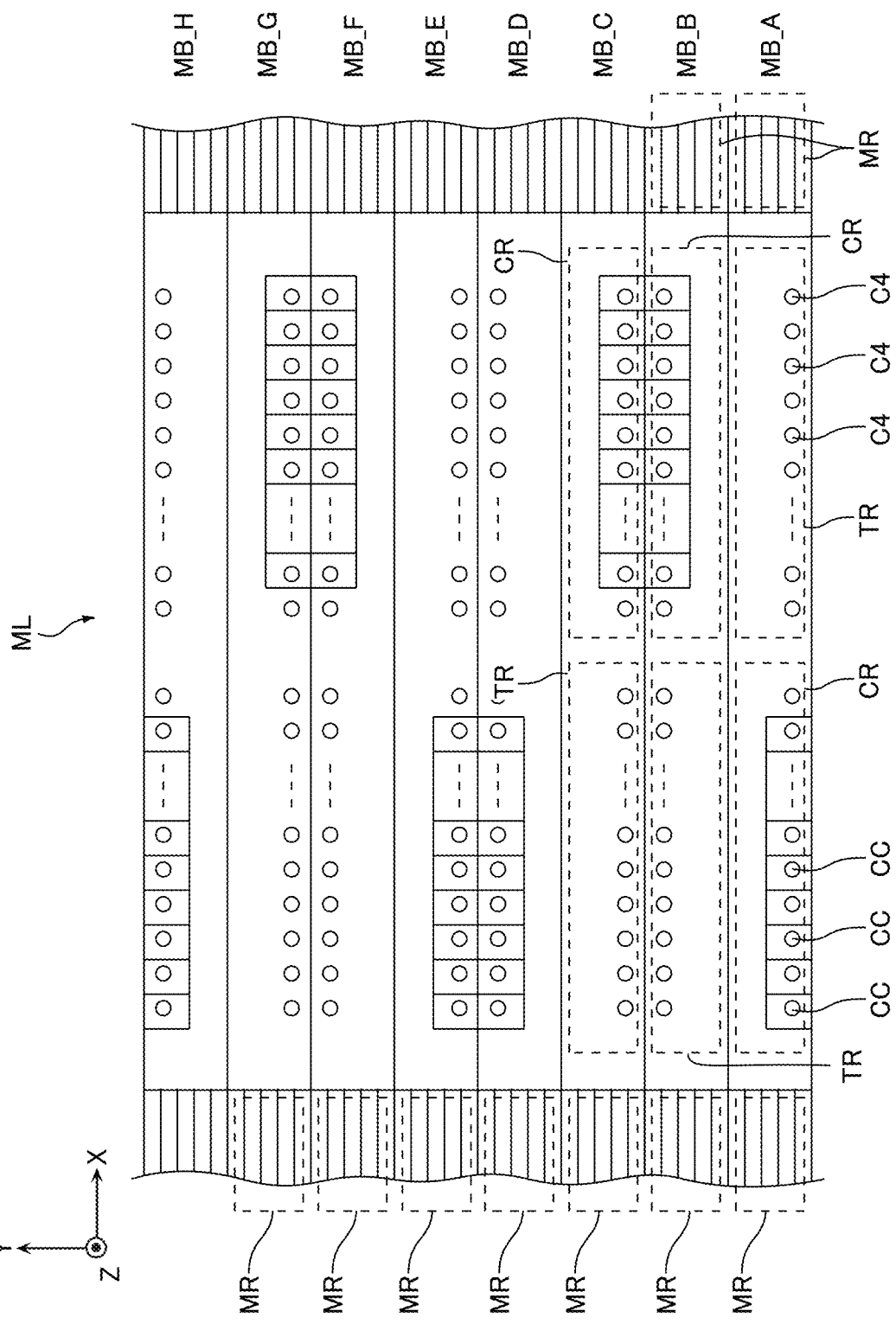
FIG. 5 is a schematic enlarged view of FIG. 4.

FIG. 5 is a schematic plan view illustrating a configuration in a region indicated by A in FIG. 4 and illustrates a configuration in the memory layer ML. As illustrated in FIG. 5, the memory cell arrays MA each include a plurality of memory blocks MB (MB_A to MB_H) arranged in the Y-direction. Additionally, the memory blocks MB each include two memory regions MR extending in the X-direction and arranged in the X-direction, contact regions CR disposed between these two memory regions MR, and a through contact region TR disposed between the contact region CR and the memory region MR.

In the example of FIG. 5, the contact regions CR and the through contact regions TR are disposed in a staggered pattern. That is, in the memory block MB_A, MB_D, MB_E, MB_H, the through contact region TR is disposed in the region on one side in the X-direction (for example, the right side in FIG. 5), and the contact region CR is disposed in the region on the other side in the X-direction (for example, the left side in FIG. 5). Meanwhile, in the memory block MB_B, MB_C, MB_F, MB_G, the contact region CR is disposed in the region on one side in the X-direction (for example, the right side in FIG. 5), and the through contact region TR is disposed in the region on the other side in the X-direction (for example, the left side in FIG. 5). The contact region CR disposed in each memory block MB is adjacent to one contact region CR and one through contact region TR in the Y-direction. Similarly, the through contact region TR disposed in each memory block MB is adjacent to one contact region CR and one through contact region TR in the Y-direction.

Figure 6:
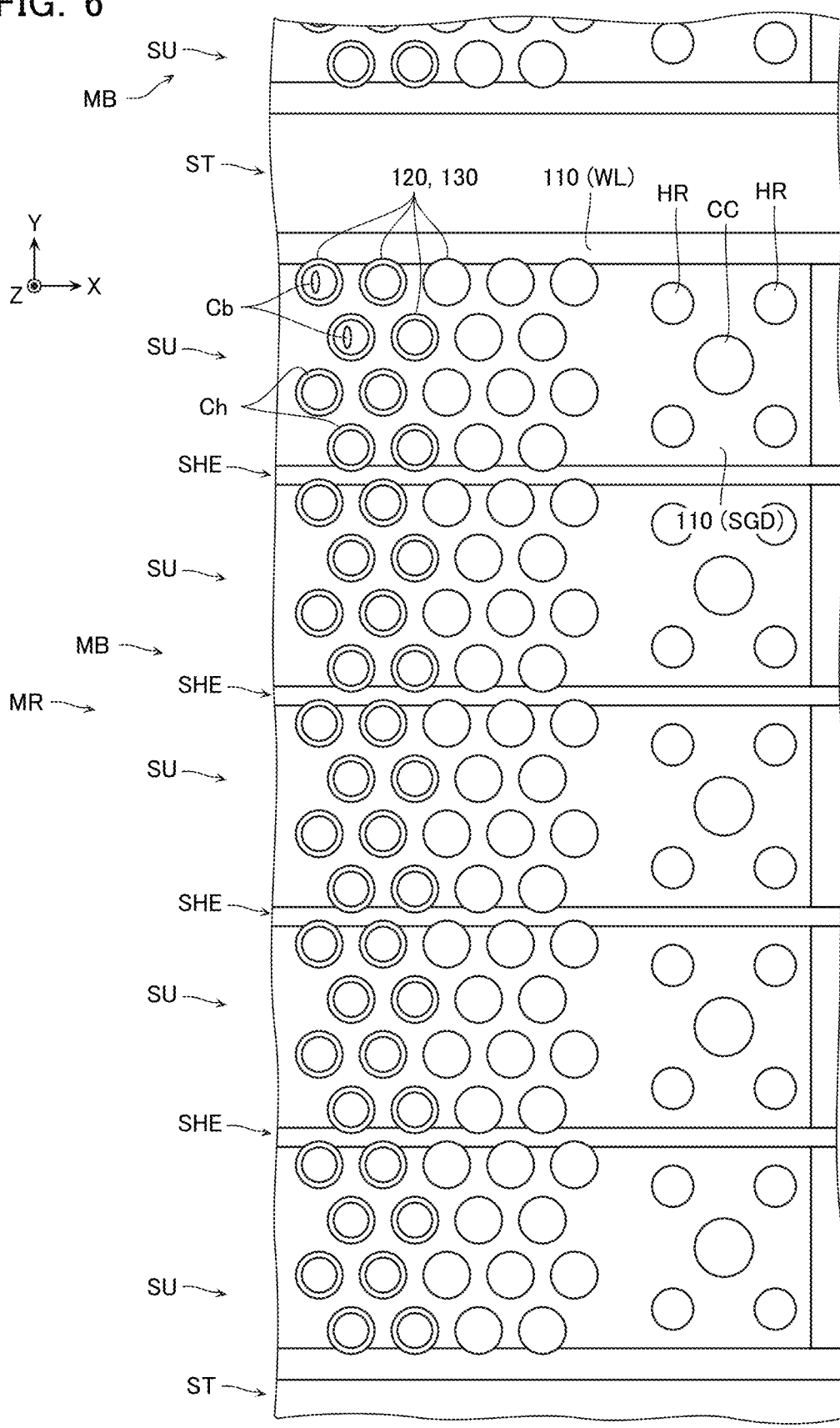
FIG. 6 is a schematic enlarged view of FIG. 5.

FIG. 6 is an enlarged view of a part of FIG. 5 and a schematic plan view illustrating the configuration in the memory region MR. In the example of FIG. 6, the memory region MR in each memory block MB includes the five string units SU arranged in the Y-direction. In each string unit SU, the plurality of semiconductor columns 120 and gate insulating films 130 described above are disposed in the X-direction and the Y-direction. Further, between the two string units SU arranged in the Y-direction, an inter-string unit insulating layer SHE is disposed. The conducting layer 110 that functions as the drain select line SGD among the plurality of conducting layers 110 is separated in the Y-direction via the inter-string unit insulating layer SHE. These conducting layers 110 are each connected to the contact CC. At the proximity of the contact CC, insulating members HR having an approximately columnar shape that support the insulating layer 101 in a manufacturing process are disposed. Additionally, between the memory blocks MB arranged in the Y-direction, an inter-memory block insulating layer ST is disposed. The plurality of conducting layers 110 are separated in the Y-direction via the inter-memory block insulating layer ST.

Figure 7:
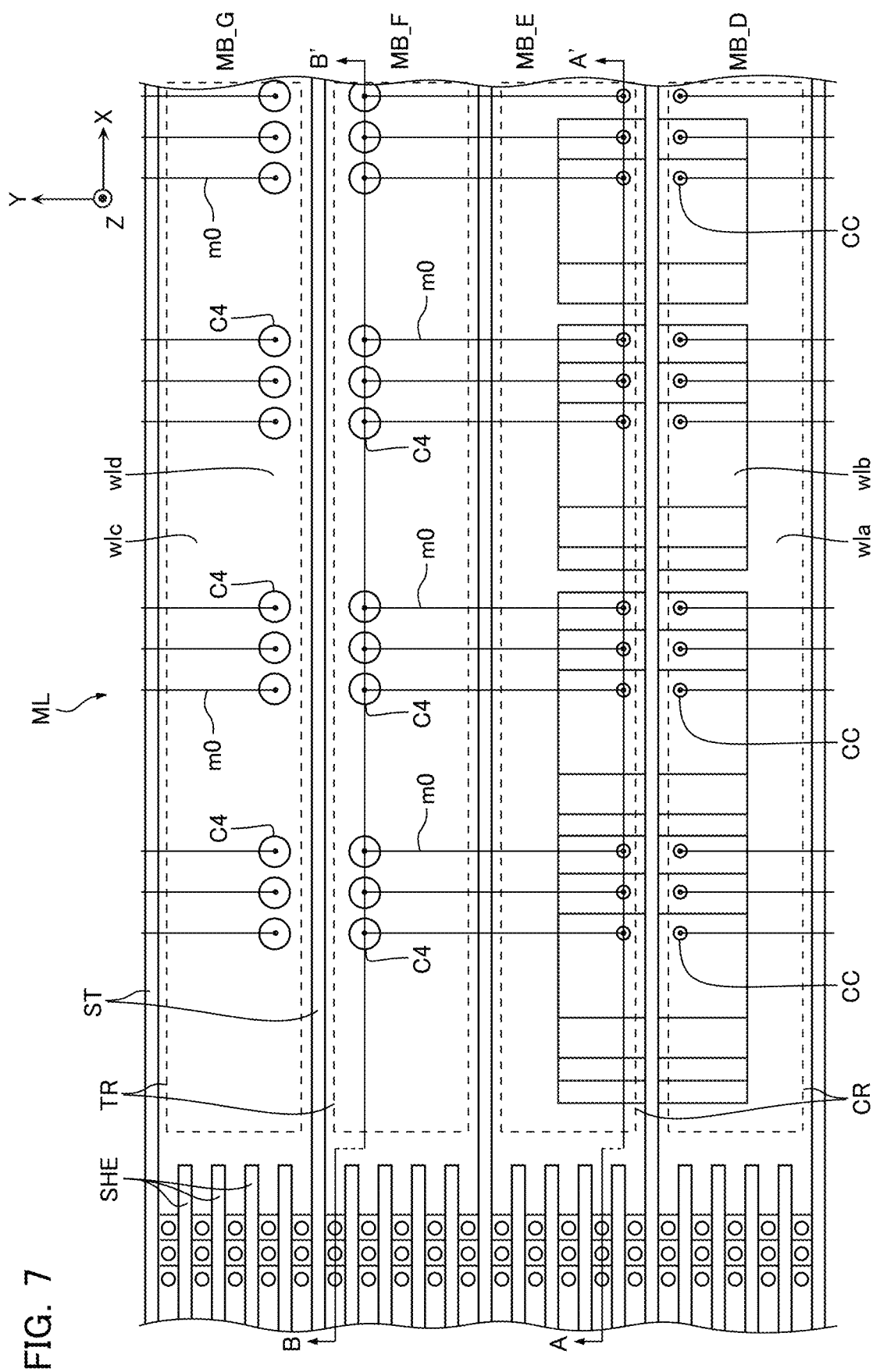
FIG. 7 is a schematic enlarged view of FIG. 5.

FIG. 7 is an enlarged view of a part of FIG. 5 and a schematic plan view illustrating configurations in the contact region CR and the through contact region TR.

The contact region CR includes a wiring region wla and a contact region wlb that extend in the X-direction and are arranged in the Y-direction. The wiring region wla includes a part of the plurality of conducting layers 110 arranged in the Z-direction. A part of these conducting layers 110 extend in the X-direction along the inter-memory block insulating layer ST. Note that the contact CC is not disposed in the wiring region wla. The contact region wlb includes the plurality of contacts CC arranged in the X-direction and a part of the plurality of conducting layers 110 arranged in the Z-direction. A part of these conducting layers 110 each include a connecting portion connected to one of the plurality of contacts CC and openings to connect the contacts CC to other conducting layers 110 on the lower side.

The through contact region TR includes a wiring region wlc and a contact region wld that extend in the X-direction and are arranged in the Y-direction. The wiring region wlc includes a part of the plurality of conducting layers 110 arranged in the Z-direction. A part of these conducting layers 110 extend in the X-direction along the inter-memory block insulating layer ST. Note that a through contact C4 is not disposed in the wiring region wlc. The contact region wld includes the plurality of through contacts C4 arranged in the X-direction and a part of the plurality of conducting layers 110 arranged in the Z-direction. A part of these conducting layers 110 include a plurality of through-holes disposed corresponding to the through contacts C4.

As described with reference to FIG. 5, the memory blocks MB each include the memory region MR disposed on one side in the X-direction (for example, the right side in FIG. 5 and FIG. 7) and the memory region MR disposed on the other side in the X-direction (for example, the left side in FIG. 5 and FIG. 7). These two memory regions MR each include a part of the plurality of conducting layers 110 arranged in the Z-direction. A part of these conducting layers 110 are connected to one another via the wiring region wla (FIG. 7) and the wiring region wlc (FIG. 7). The plurality of conducting layers 110 are connected to the plurality of transistors Tr disposed on the surface of the semiconductor substrate S via the plurality of contacts CC, wirings m0 extending in the Y-direction, and the through contacts C4.

Figure 8:
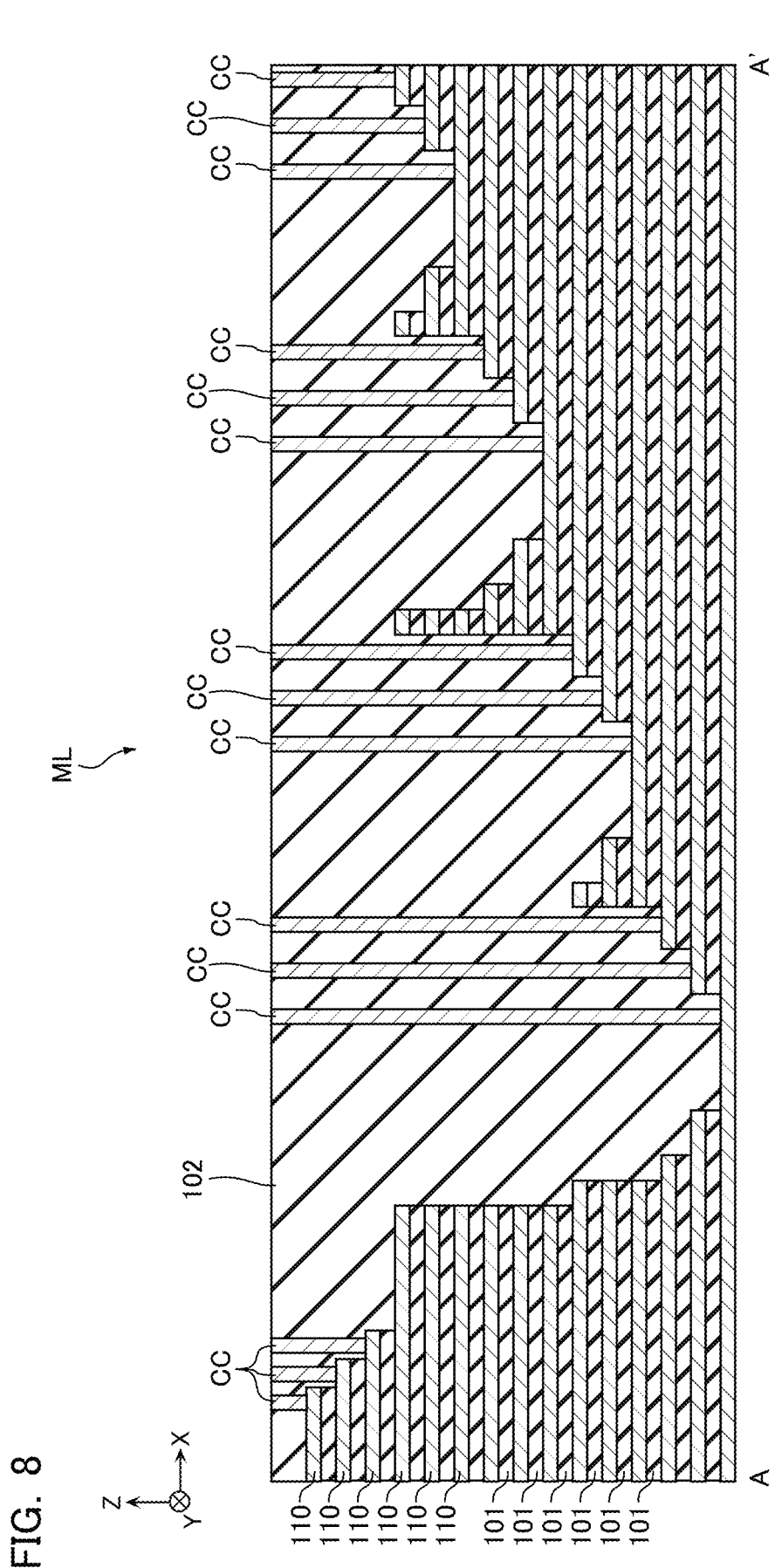
FIG. 8 is a schematic cross-sectional view taking the structure illustrated in FIG. 7 along the line A-A" and viewed in the arrow direction.

FIG. 8 is a schematic cross-sectional view taking the configuration illustrated in FIG. 7 along the line A-A" and viewed in the arrow direction. As illustrated in FIG. 8, the contacts CC extend in the Z-direction and are connected to the conducting layers 110 at the lower ends. Between the contacts CC, insulating layers 102, such as silicon oxide (SiO$_2$), are disposed.

Figure 9:
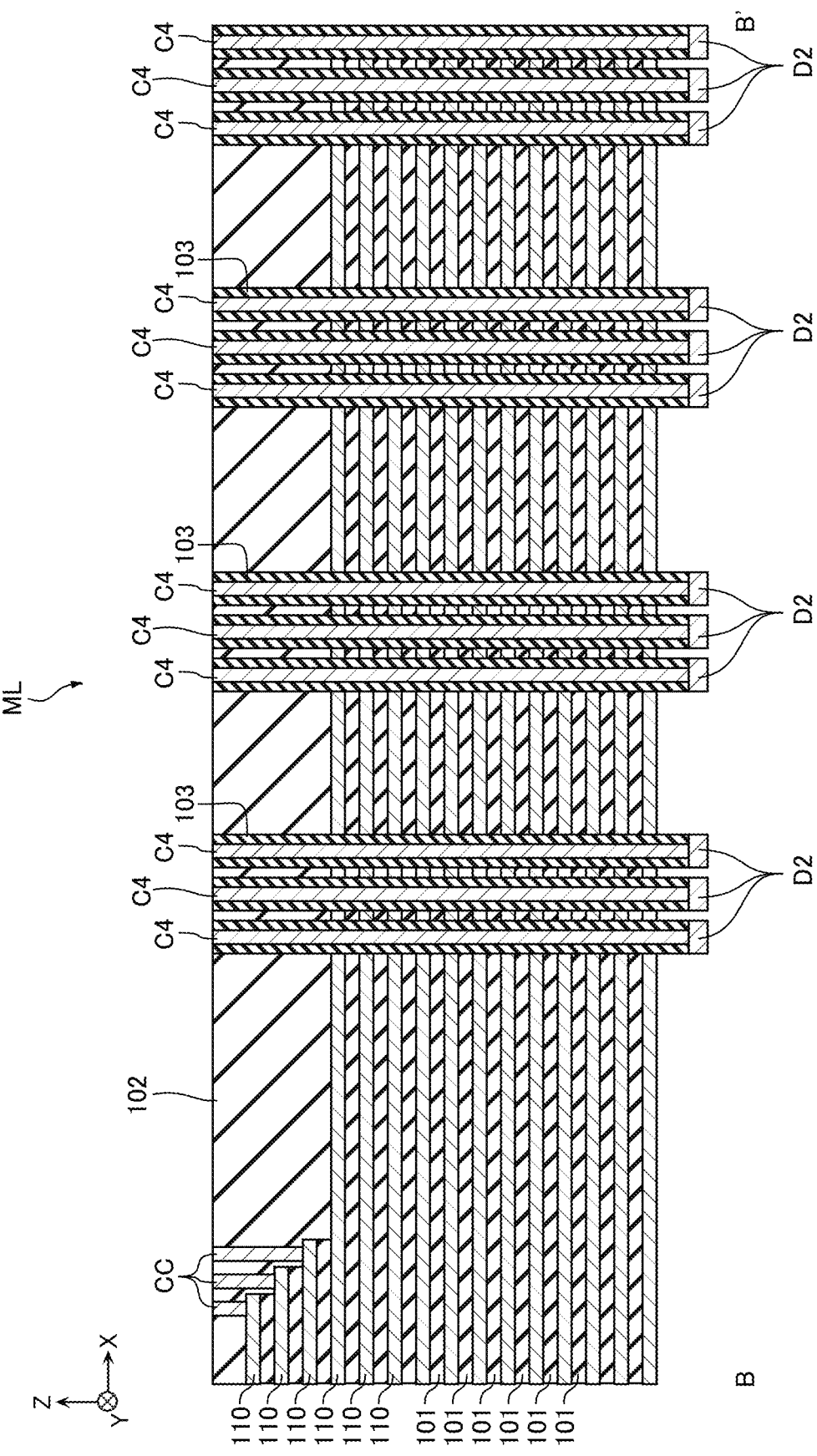
FIG. 9 is a schematic cross-sectional view taking the structure illustrated in FIG. 7 along the line B-B" and viewed in the arrow direction.

FIG. 9 is a schematic cross-sectional view taking the configuration illustrated in FIG. 7 along the line B-B" and viewed in the arrow direction. As illustrated in FIG. 9, the through contacts C4 extend in the Z-direction penetrating the plurality of conducting layers 110 and insulating layers 101 and are connected to wirings D2 in the circuit layer CL. The respective through contacts C4 are electrically insulated from the conducting layers 110 via, for example, insulating layers. For example, in the illustrated example, insulating layers 103, such as silicon oxide (SiO$_2$), that cover the outer peripheral surfaces of the through contacts C4 are disposed between the respective through contacts C4 and the conducting layers 110, and the respective through contacts C4 are electrically insulated from the conducting layers 110 with the insulating layers 103. Note that the configuration is merely an example, and the specific configuration is appropriately adjustable. For example, a plurality of insulating layers, such as silicon nitride (SiN), arranged in the Z-direction may be disposed between the through contacts C4 and the conducting layers 110 via the plurality of insulating layers 101, and the respective through contacts C4 may be electrically insulated from the conducting layers 110 with the plurality of insulating layers, such as silicon nitride. In this case, for example, the insulating layers 103 as illustrated in FIG. 9 as an example may be disposed or may be omitted.

[Circuit Layer CL]

Figure 10:
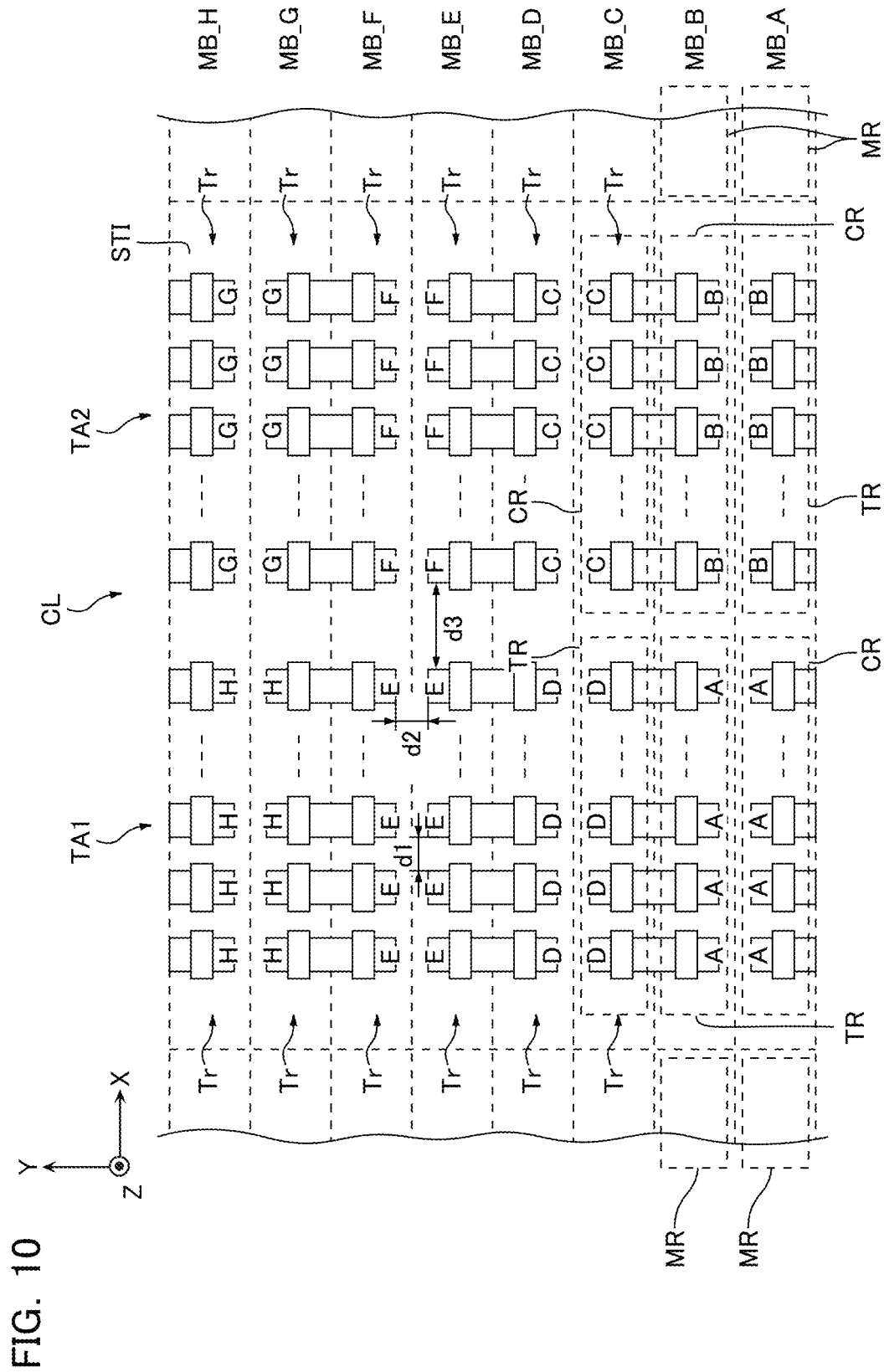
FIG. 10 is a schematic plan view of the semiconductor memory device.

FIG. 10 is a schematic plan view illustrating a configuration in the region indicated by A in FIG. 4 and illustrates the configuration in the circuit layer CL. In the example of FIG. 10, transistor arrays TA1, TA2 are disposed on the surface of the semiconductor substrate S.

The transistor arrays TA1, TA2 include the plurality of transistors Tr arranged in a matrix in the X-direction and the Y-direction. The plurality of transistors Tr each function as the block driving transistor 35 (FIG. 1). Note that, in the illustrated example, an arrangement cycle of the transistors Tr in the Y-direction matches an arrangement cycle of the memory blocks MB in the Y-direction.

The transistor arrays TA1 are disposed in regions corresponding to the contact regions CR in the memory blocks MB_A, MB_D, MB_E, MB_H and the through contact regions TR in the memory blocks MB_B, MB_C, MB_F, MB_G. Among the plurality of transistors Tr included in the transistor array TA1, the transistors Tr disposed in the regions corresponding to the memory blocks MB_A, MB_B are connected to the conducting layers 110 in the memory block MB_A. The transistors Tr disposed in the regions corresponding to the memory blocks MB_C, MB_D are connected to the conducting layers 110 in the memory block MB_D. The transistors Tr disposed in the regions corresponding to the memory blocks MB_E, MB_F are connected to the conducting layers 110 in the memory block MB_E. The transistors Tr disposed in the regions corresponding to the memory blocks MB_G, MB_H are connected to the conducting layers 110 in the memory block MB_H.

The transistor arrays TA2 are disposed in regions corresponding to the through contact regions TR in the memory blocks MB_A, MB_D, MB_E, MB_H and the contact regions CR in the memory blocks MB_B, MB_C, MB_F, MB_G. Among the plurality of transistors Tr included in the transistor array TA2, the transistors Tr disposed in the regions corresponding to the memory blocks MB_A, MB_B are connected to the conducting layers 110 in the memory block MB_B. The transistors Tr disposed in the regions corresponding to the memory blocks MB_C, MB_D are connected to the conducting layers 110 in the memory block MB_C. The transistors Tr disposed in the regions corresponding to the memory blocks MB_E, MB_F are connected to the conducting layers 110 in the memory block MB_F. The transistors Tr disposed in the regions corresponding to the memory blocks MB_G, MB_H are connected to the conducting layers 110 in the memory block MB_G.

Note that among the plurality of transistors Tr included in the transistor arrays TA1, TA2, the two transistors Tr adjacent in the X-direction or the Y-direction via the insulating layer STI are connected to the conducting layers 110 in the same memory block. Additionally, a distance d1 between the two transistors Tr adjacent in the X-direction via the insulating layer STI and a distance d2 between the two transistors Tr adjacent in the Y-direction via the insulating layer STI are smaller than a distance d3 between the transistor arrays TA1, TA2. Note that these distances d1, d2, d3 are, for example, the shortest distances in the region disposed on the surface of the semiconductor substrate S. The plurality of transistors Tr included in the transistor arrays TA1, TA2 are each connected to another transistor Tr via a common source region. The two transistors Tr having the common source region are connected to the conducting layers 110 in the different memory blocks MB.

Figure 11:
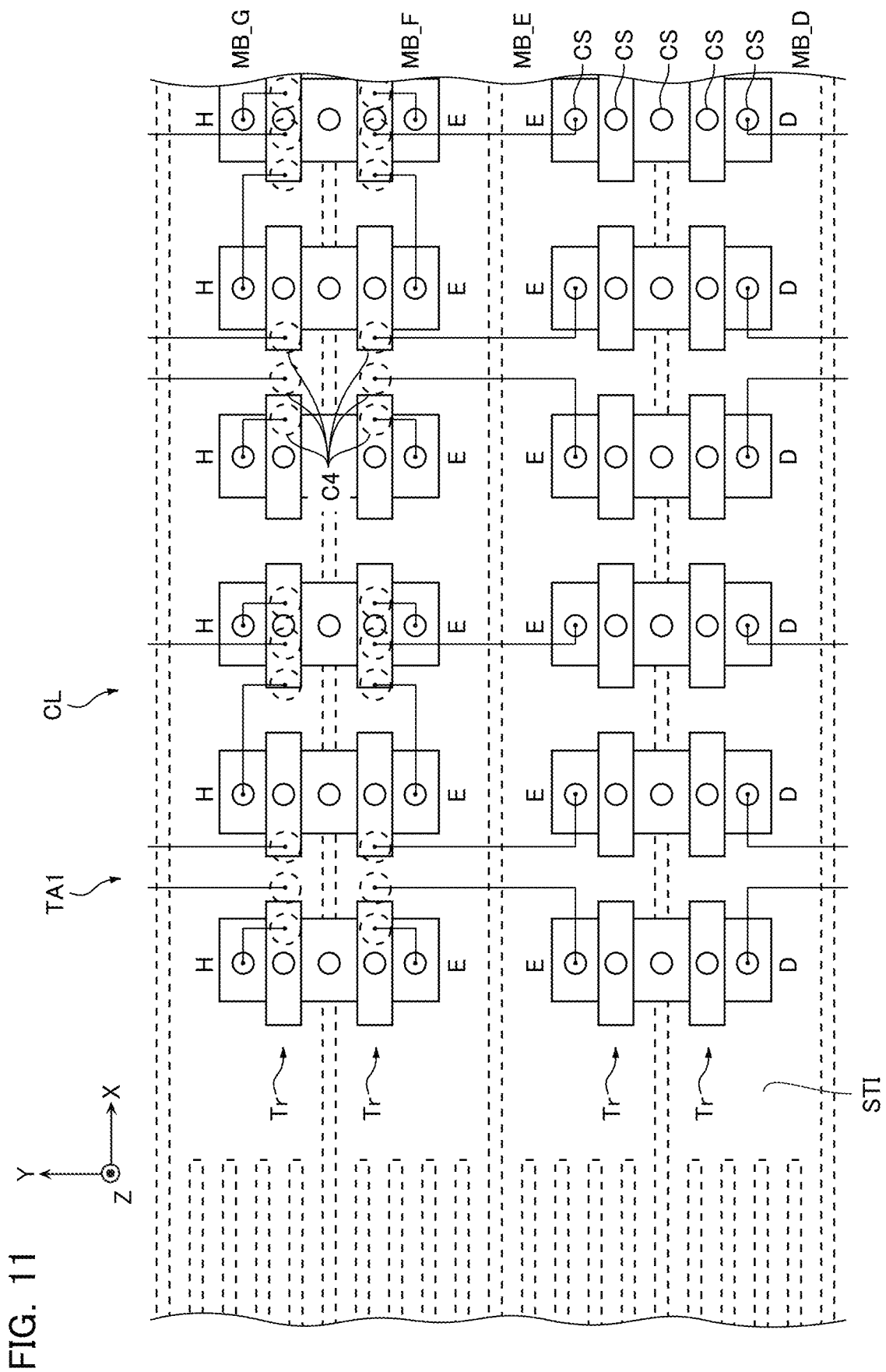
FIG. 11 is a schematic enlarged view of FIG. 10.

FIG. 11 is an enlarged view of a part of FIG. 10. The contacts CS are connected to the source region, the drain region, and the gate electrode of each transistor Tr. The contact CS connected to the source region of the transistor Tr is connected to the wiring CG (FIG. 1). The contact CS connected to the drain region of the transistor Tr is connected to the conducting layer 110 via the through contact C4, the wiring m0, and the contact CC (for example, see FIG. 7). The contact CS connected to the gate electrode of the transistor Tr is connected to the block select line BLK-SEL (FIG. 1).

[Manufacturing Method]

Next, with reference to FIG. 12 to FIG. 23, a part of the method for manufacturing the semiconductor memory device according to the embodiment will be described. FIG. 12 to FIG. 15, FIG. 17, FIG. 19, FIG. 21, and FIG. 23 are schematic X-Z cross-sectional views for describing the manufacturing method and correspond to the cross-sectional surface illustrated in FIG. 8. FIG. 16, FIG. 18, FIG. 20, and FIG. 22 are schematic plan views for describing the manufacturing method and correspond to the plane illustrated in FIG. 7.

In the manufacturing method, the circuit layer CL (FIG. 2) is formed on the semiconductor substrate S.

Figure 12:
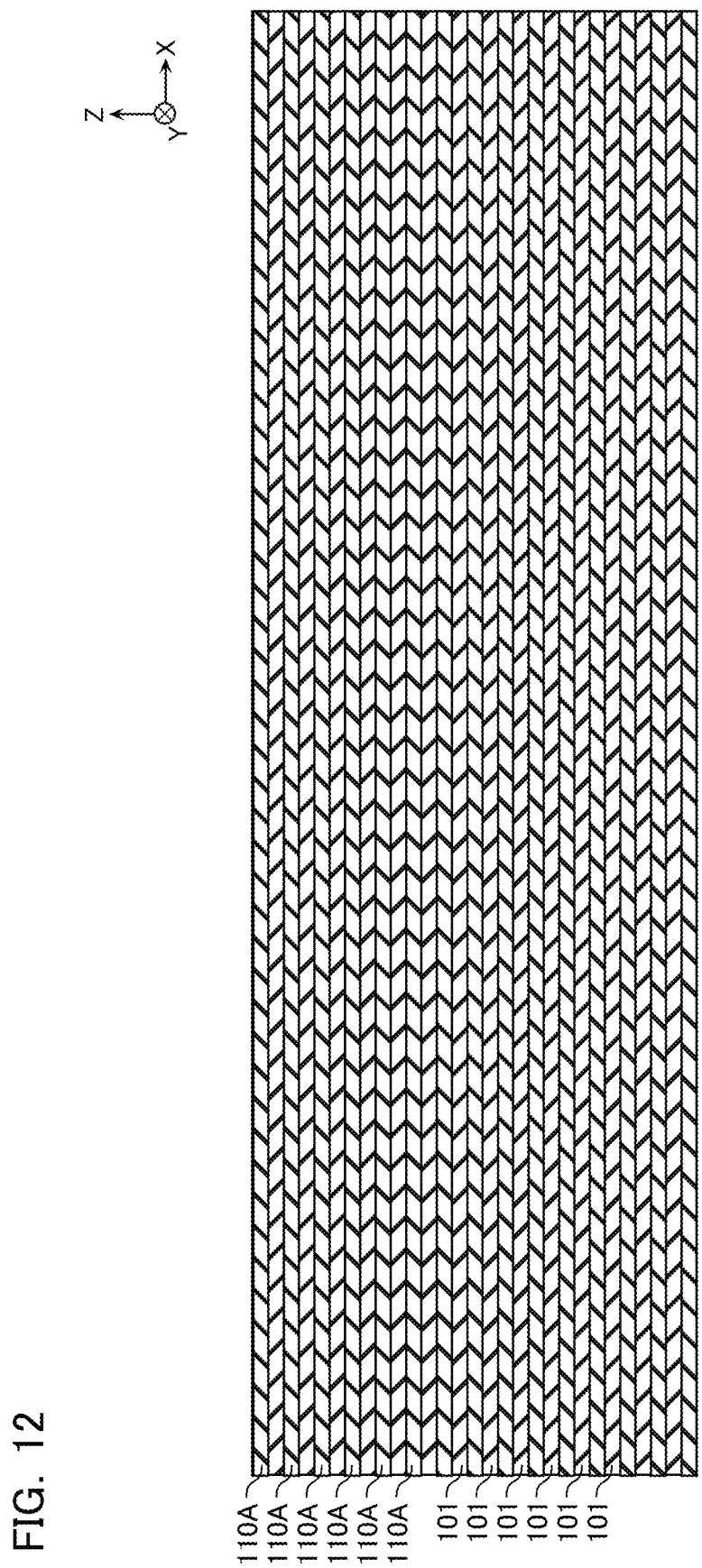
FIG. 12 is a schematic view illustrating a method for manufacturing the semiconductor memory device.

Next, for example, as illustrated in FIG. 12, a plurality of sacrificial layers 110A and the insulating layers 101 are formed on the circuit layer CL. The sacrificial layer 110A contains, for example, silicon nitride (SiN). This process is, for example, performed by a method such as Chemical Vapor Deposition (CVD).

Figure 13:
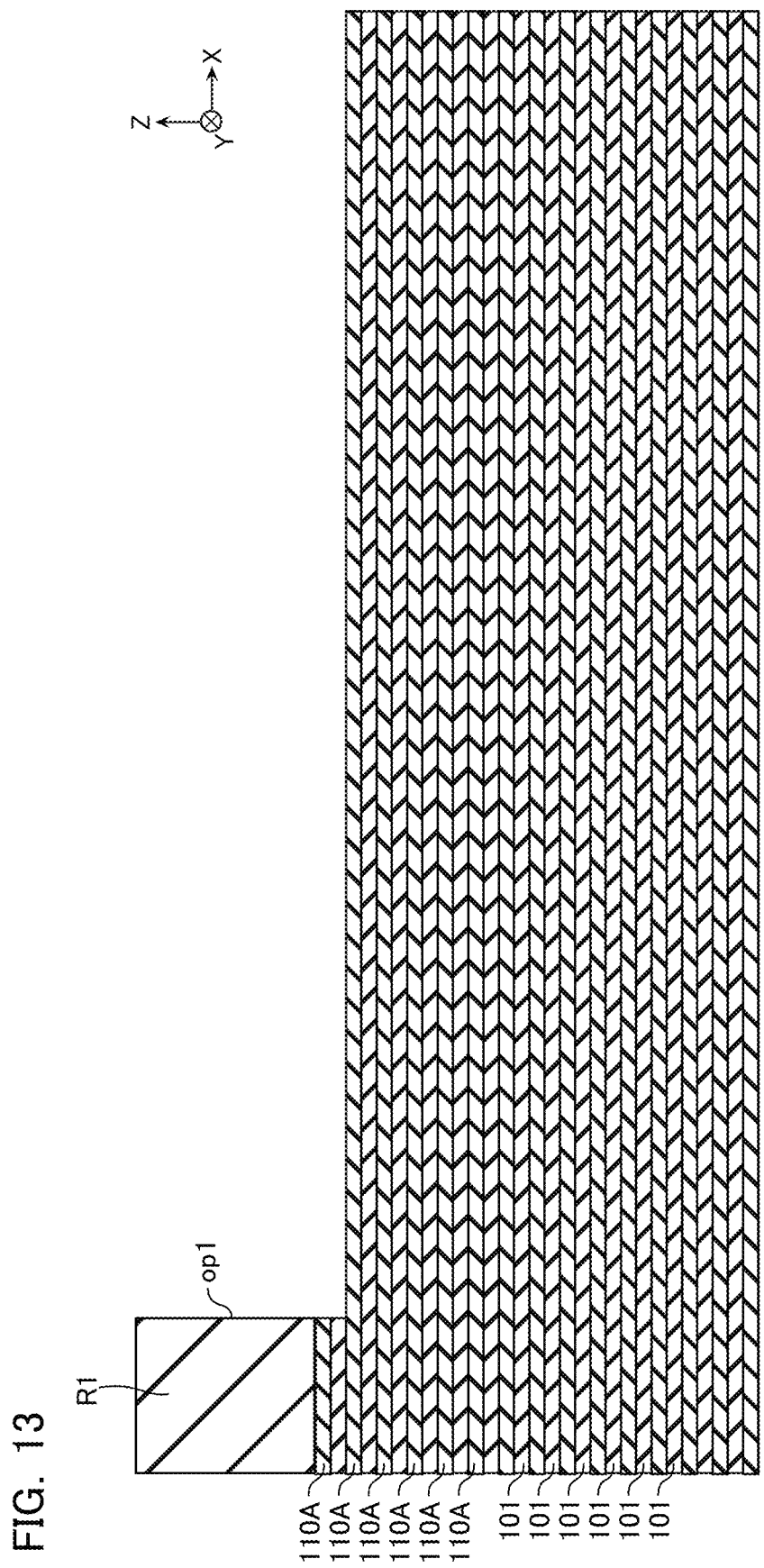
FIG. 13 is a schematic view illustrating the method for manufacturing the semiconductor memory device.

Next, for example, as illustrated in FIG. 13, a resist R1 is formed on the upper surface of the structure illustrated in FIG. 12. The resist R1 has an opening op1 to expose a region where the contact region CR and the through contact region TR are disposed and covers the other region.

Next, for example, as illustrated in FIG. 13, by wet etching or dry etching, such as Reactive Ion Etching (RIE), (hereinafter referred to as "etching or the like") via the opening op1, the insulating layers 101 and the sacrificial layers 110A are removed by one layer.

Figure 14:
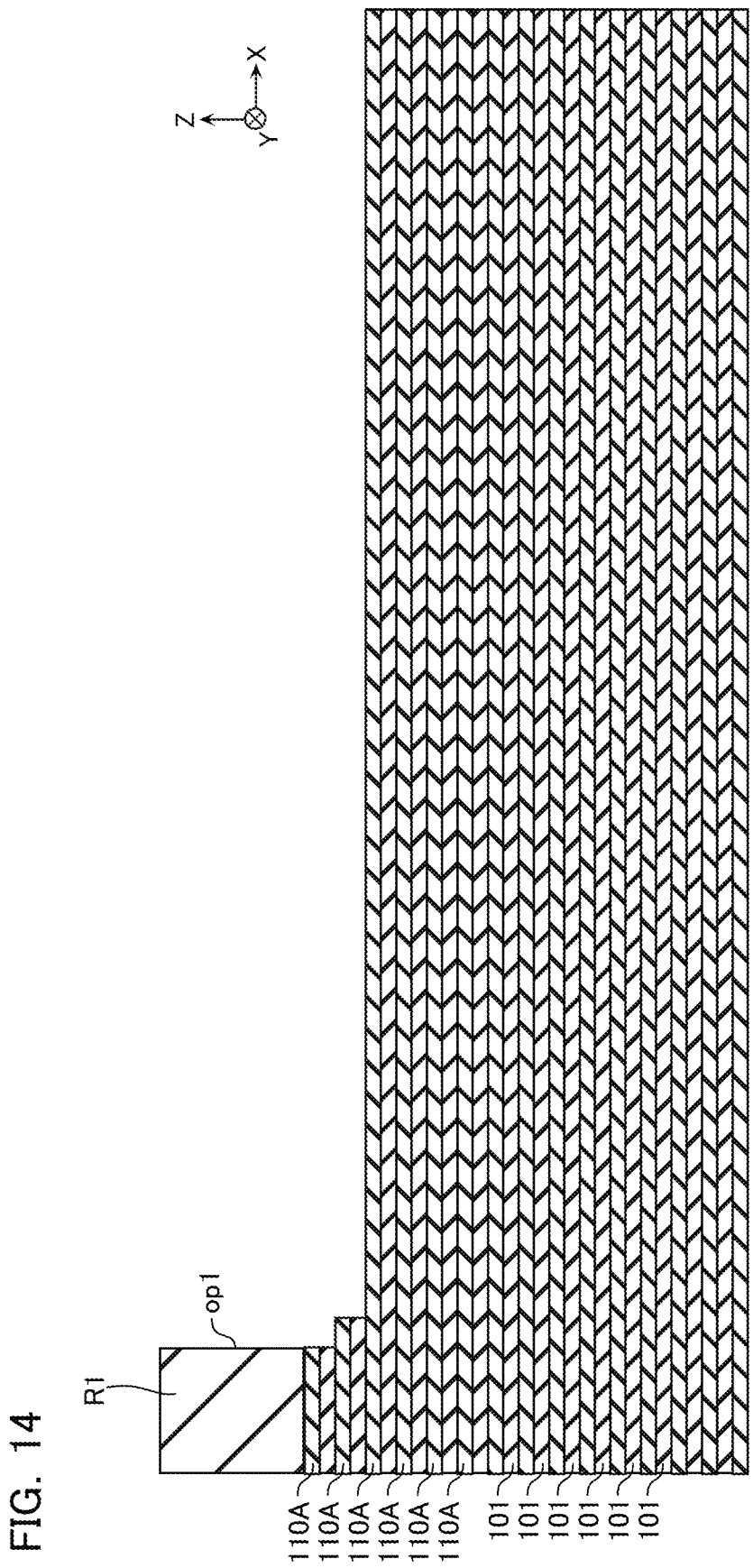
FIG. 14 is a schematic view illustrating the method for manufacturing the semiconductor memory device.

Next, as illustrated in FIG. 14, a part of the resist R1 is isotropically removed by wet etching or the like. This expands the opening op1 in the X-direction. Additionally, by etching or the like via the opening op1, the insulating layers 101 and the sacrificial layers 110A are removed by one layer.

Figure 15:
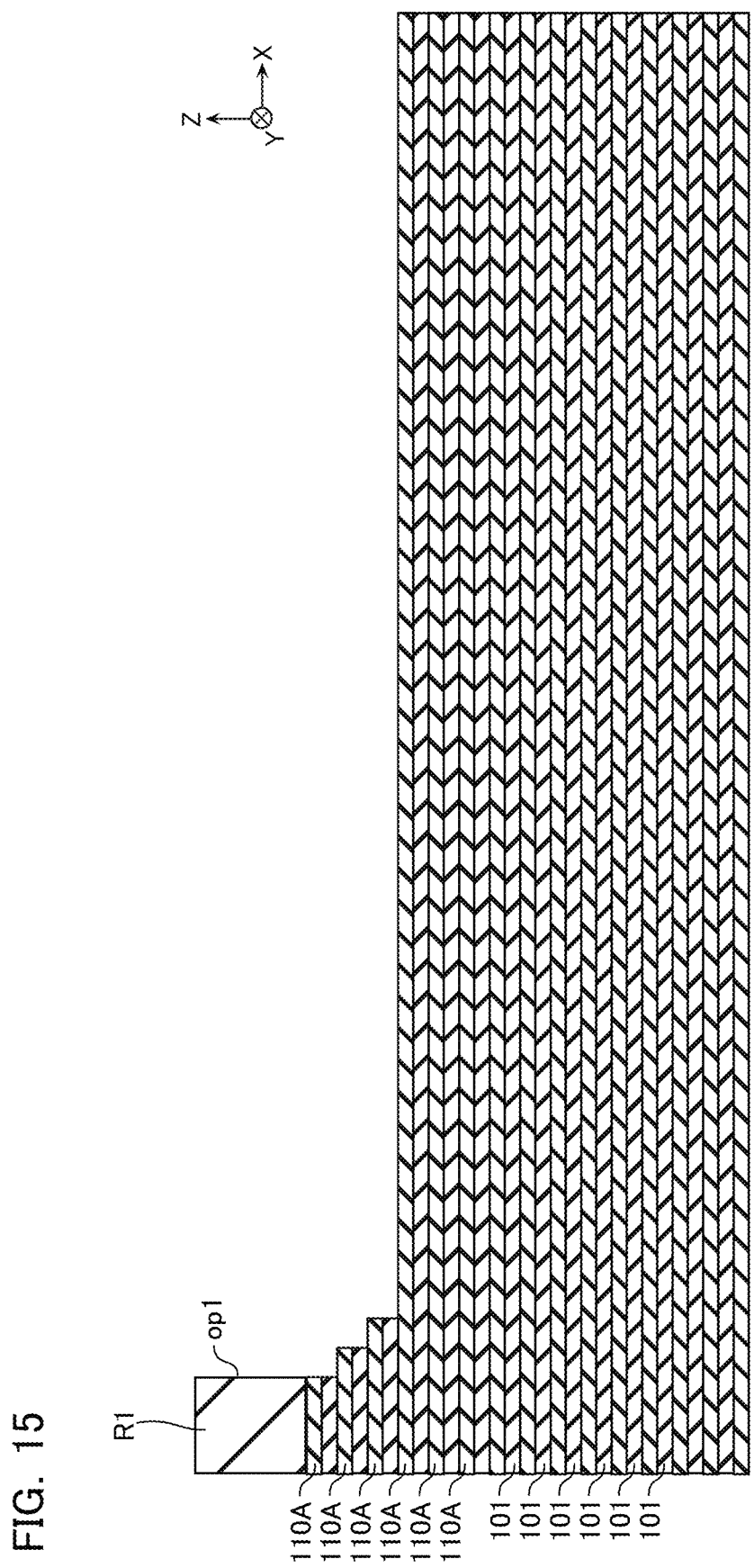
FIG. 15 is a schematic view illustrating the method for manufacturing the semiconductor memory device.

Next, as illustrated in FIG. 15, a part of the resist R1 is isotropically removed by wet etching or the like. This expands the opening op1 in the X-direction. Additionally, by etching or the like via the opening op1, the insulating layers 101 and the sacrificial layers 110A are removed by one layer.

Figure 16:
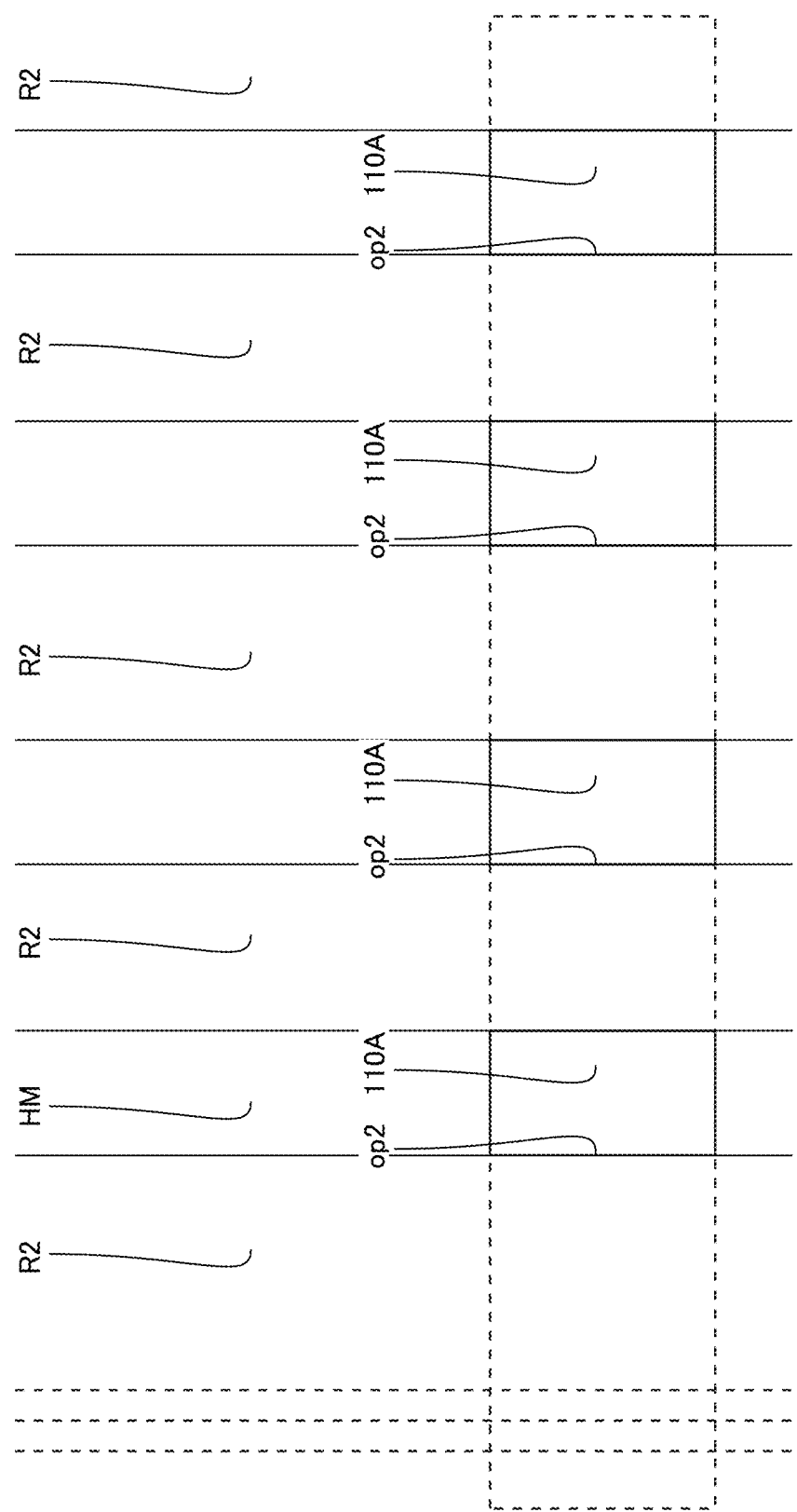
FIG. 16 is a schematic view illustrating the method for manufacturing the semiconductor memory device.
Figure 17:
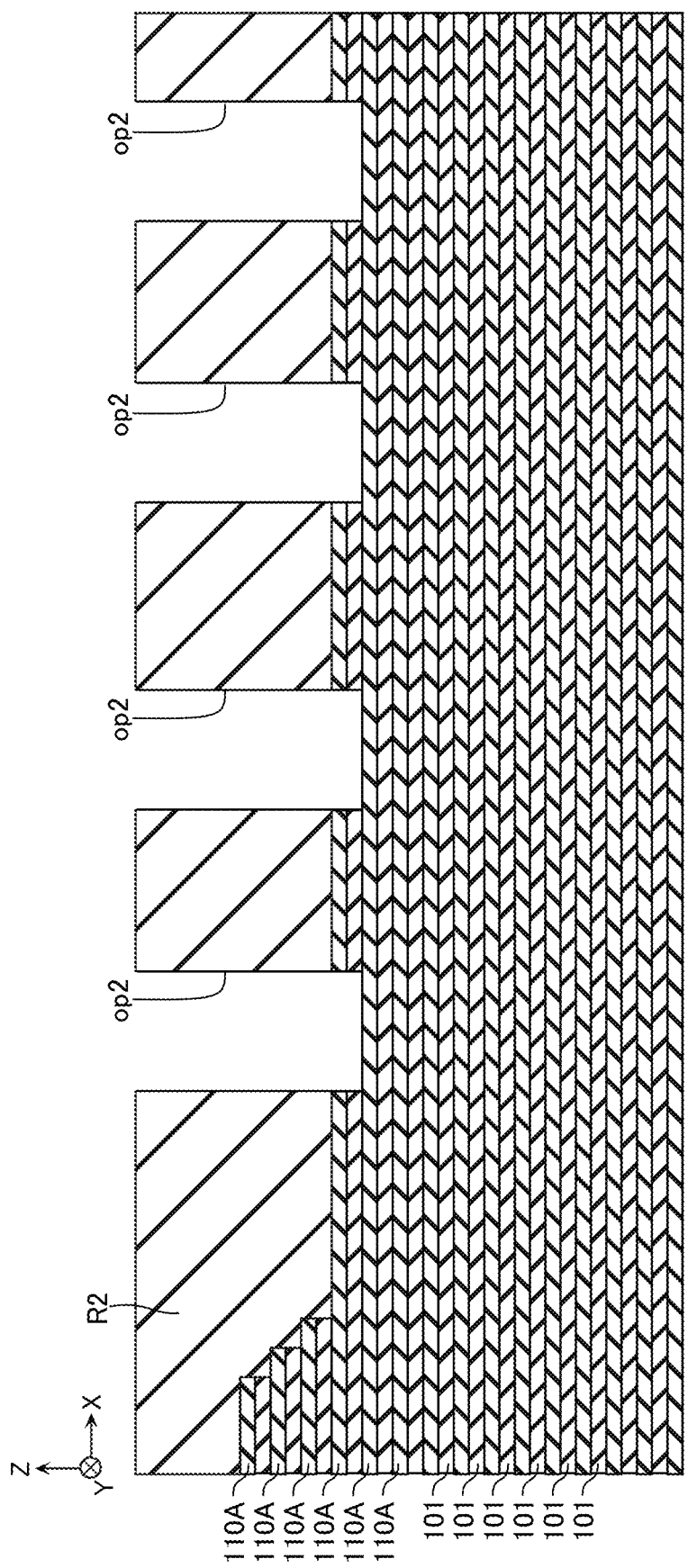
FIG. 17 is a schematic view illustrating the method for manufacturing the semiconductor memory device.

Next, as illustrated in FIG. 16 and FIG. 17, the resist R1 is removed and hard masks HM and resists R2 are formed on the upper surface of the structure illustrated in FIG. 15. The hard masks HM have openings extending in the X-direction in the contact region CR and covers the other region. The resist R2 exposes a part of the region of the opening disposed in the hard mask and covers the other region. Hereinafter, a region not covered with the hard mask HM or the resists R2 is referred to as an opening op2.

Next, as illustrated in FIG. 17, by etching or the like via the openings op2, the insulating layers 101 and the sacrificial layers 110A are removed by one layer.

Figure 18:
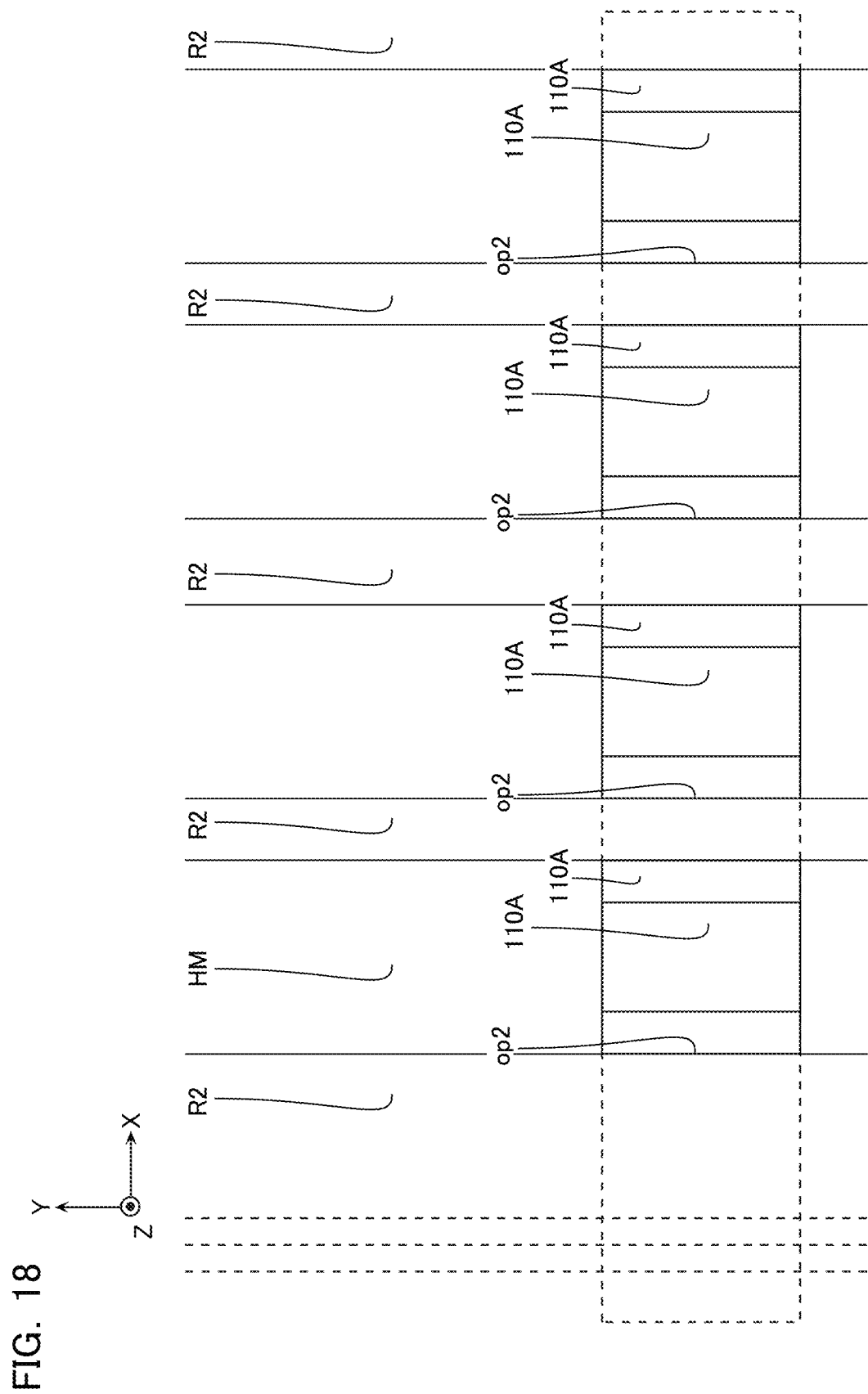
FIG. 18 is a schematic view illustrating the method for manufacturing the semiconductor memory device.

Next, as illustrated in FIG. 18, a part of the resists R2 are isotropically removed by wet etching or the like. This expands the openings op2 in the X-direction.

Figure 19:
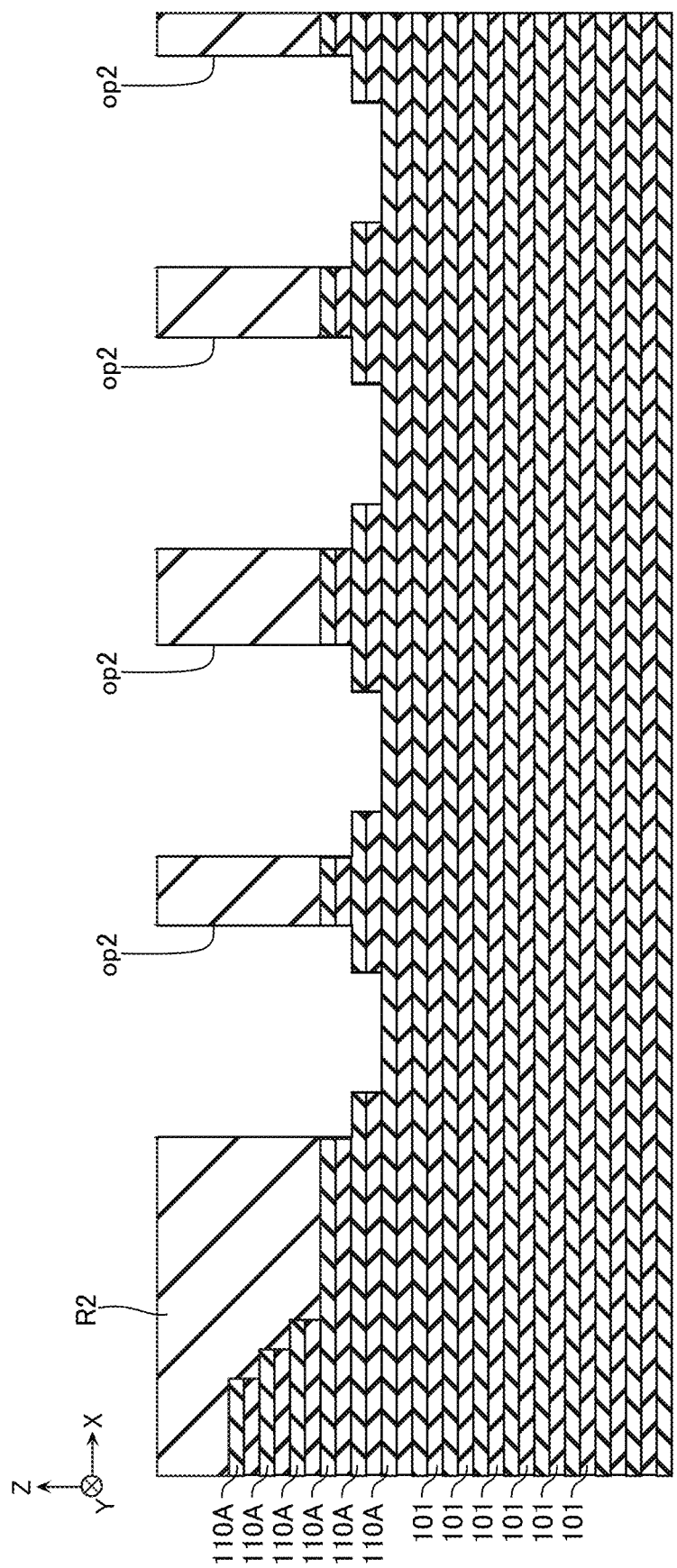
FIG. 19 is a schematic view illustrating the method for manufacturing the semiconductor memory device.

Next, as illustrated in FIG. 19, by etching or the like via the openings op2, the insulating layers 101 and the sacrificial layers 110A are removed by one layer.

Figure 20:
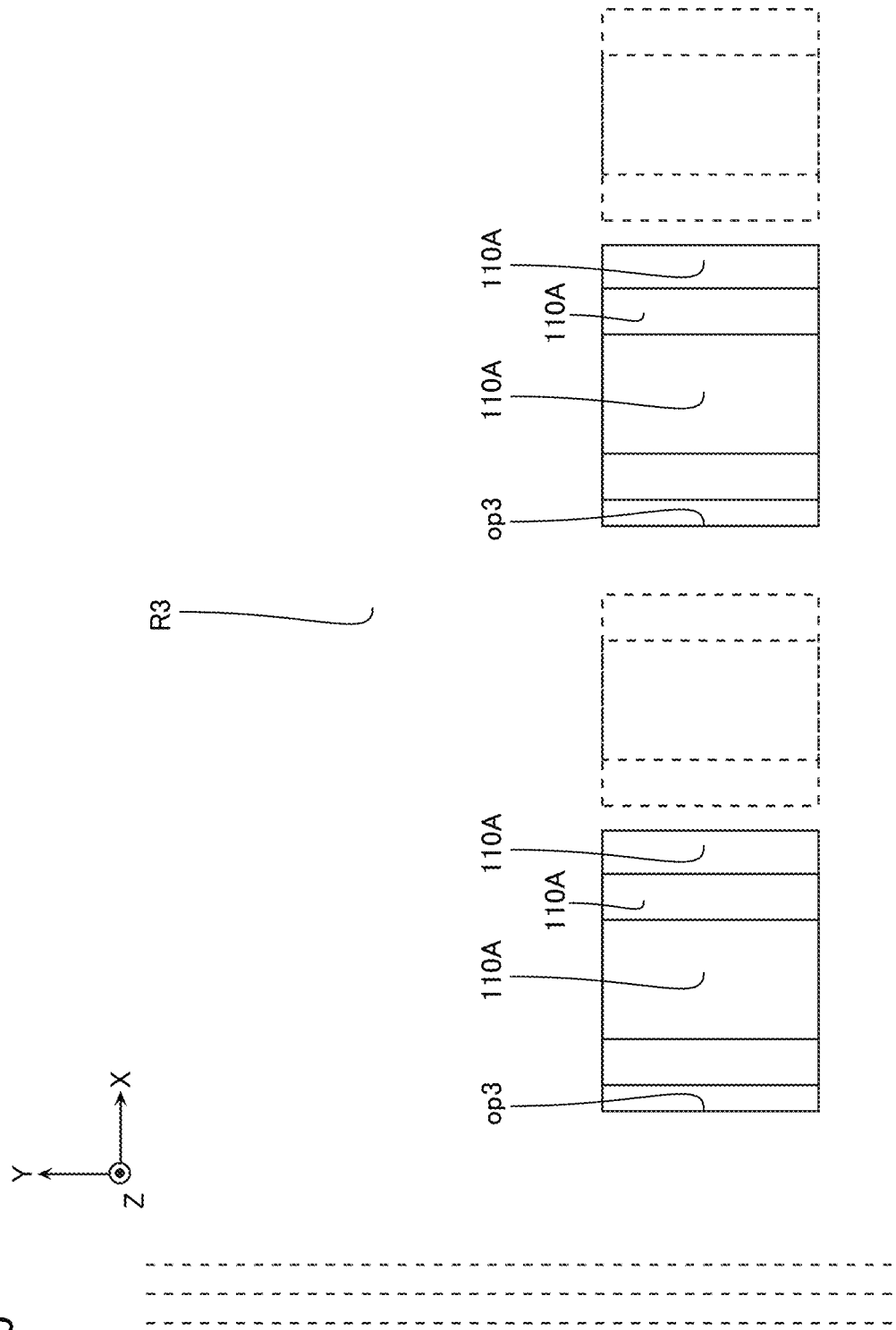
FIG. 20 is a schematic view illustrating the method for manufacturing the semiconductor memory device.

Next, as illustrated in FIG. 20, the hard masks HM and the resists R2 are removed and a resist R3 is formed on the upper surface of the structure illustrated in FIG. 19. The resist R3 has, for example, a plurality of openings op3 that expose regions corresponding to the odd-numbered openings op2 counted from one side or the other side in the X-direction and cover the other regions.

Figure 21:
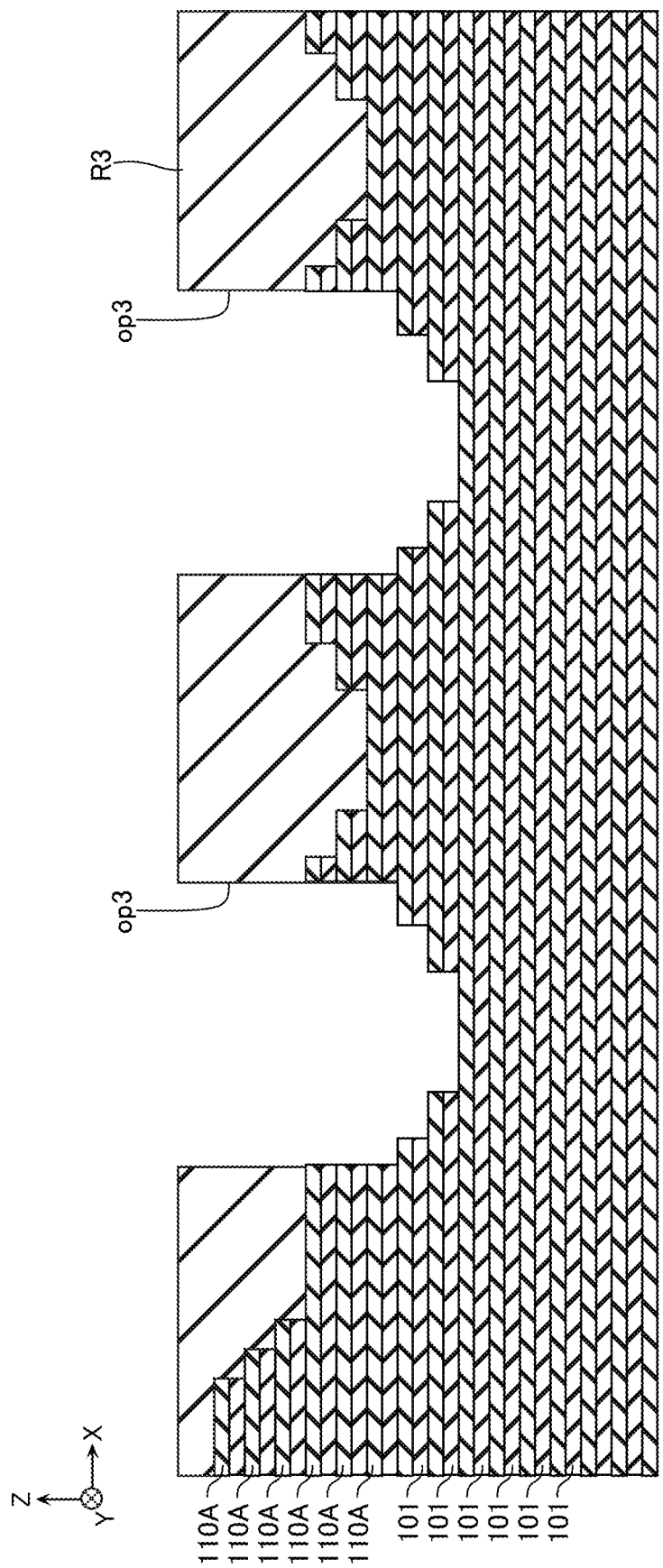
FIG. 21 is a schematic view illustrating the method for manufacturing the semiconductor memory device.

Next, as illustrated in FIG. 21, by etching or the like via the openings op3, the insulating layers 101 and the sacrificial layers 110A are removed by a plurality of layers. For example, the numbers of layers of the insulating layers 101 and the sacrificial layers 110A removed in this process are larger than the numbers of layers of the insulating layers 101 and the sacrificial layers 110A removed by etching or the like via the openings op2 in the resists R2 by one layer for each.

Figure 22:
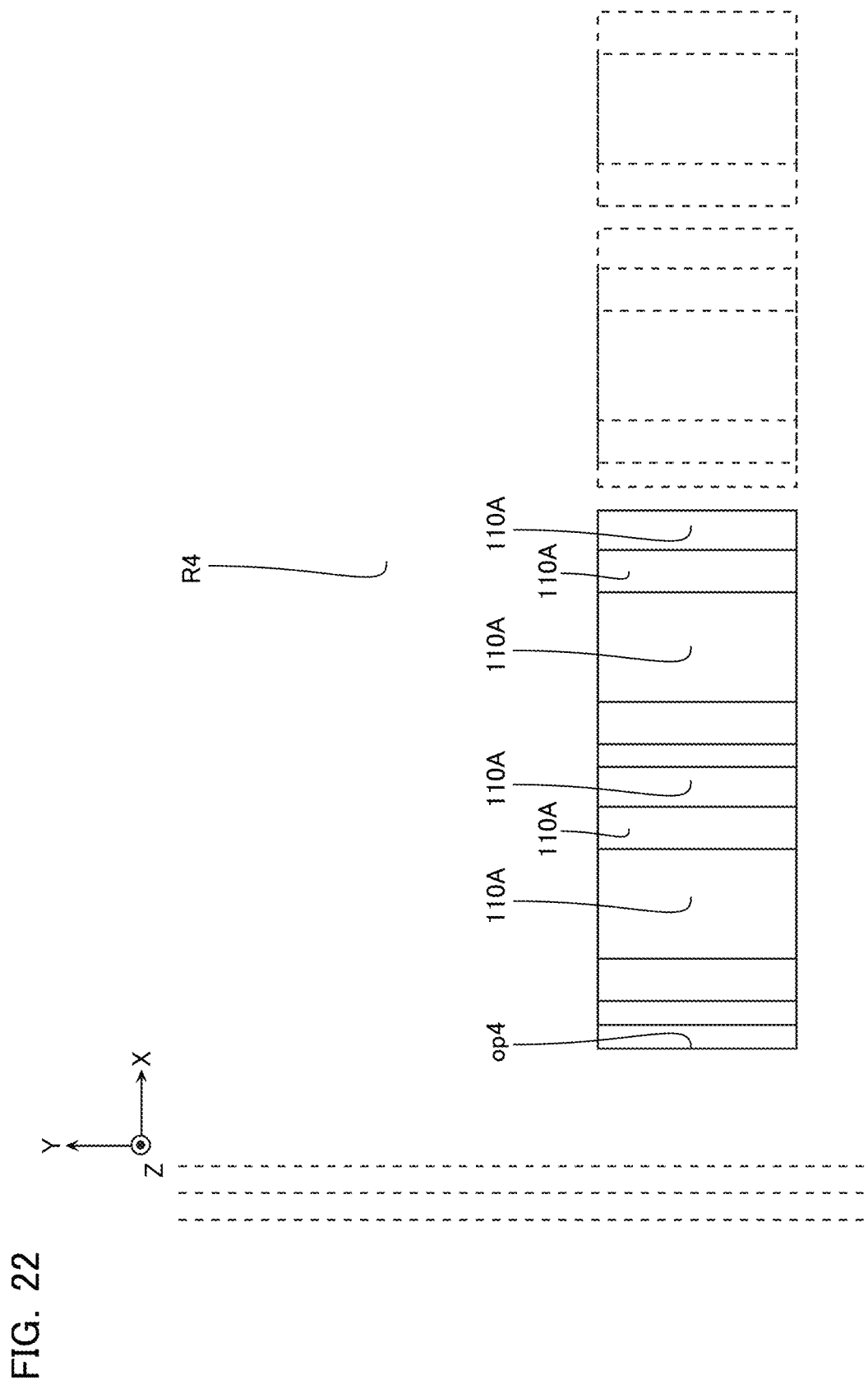
FIG. 22 is a schematic view illustrating the method for manufacturing the semiconductor memory device.

Next, as illustrated in FIG. 22, the resist R3 is removed and a resist R4 is formed on the upper surface of the structure illustrated in FIG. 21. For example, the resist R4 includes openings op4 that expose regions corresponding to a part of the plurality of odd-numbered openings op2 counted from the X-direction, a part of the plurality of even-numbered openings op2 counted from the X-direction, and a part of the plurality of openings op3 and covers the other regions.

Figure 23:
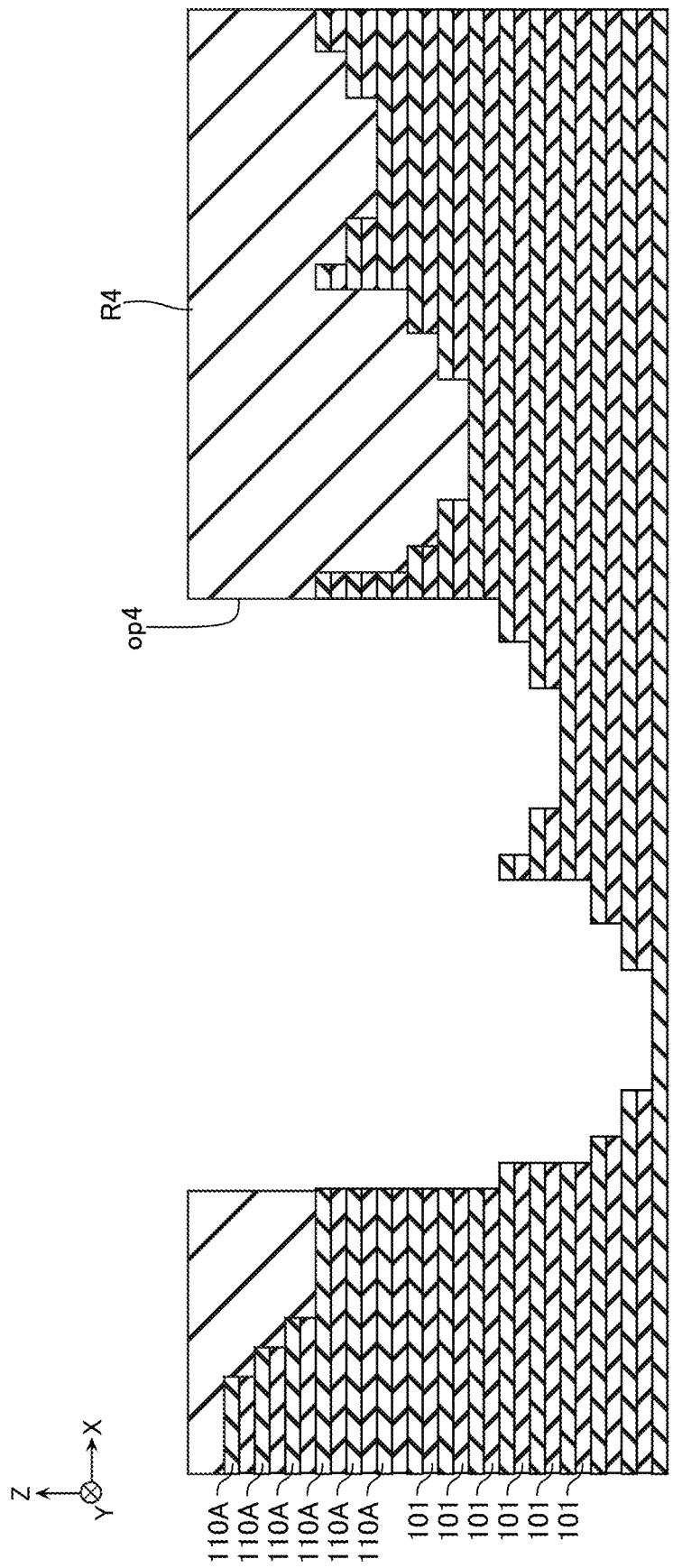
FIG. 23 is a schematic view illustrating the method for manufacturing the semiconductor memory device.

Next, as illustrated in FIG. 23, by etching or the like via the openings op4, the insulating layers 101 and the sacrificial layers 110A are removed by a plurality of layers. For example, the numbers of layers of the insulating layers 101 and the sacrificial layers 110A removed in this process are larger than a sum of the numbers of layers of the insulating layers 101 and the sacrificial layers 110A removed by etching or the like via the openings op2 in the resists R2 and the numbers of layers of the insulating layers 101 and the sacrificial layers 110A removed by etching or the like via the openings op3 in the resist R3 by one layer for each.

Afterwards, the semiconductor columns 120, the gate insulating films 130, the through contacts C4, and the like are formed, the sacrificial layers 110A are removed to form the conducting layers 110, and the contacts CC and the like are formed on the formed configuration, and thus the configuration described with reference to FIG. 4 to FIG. 11 is formed.

[First Comparative Example]

Figure 24:
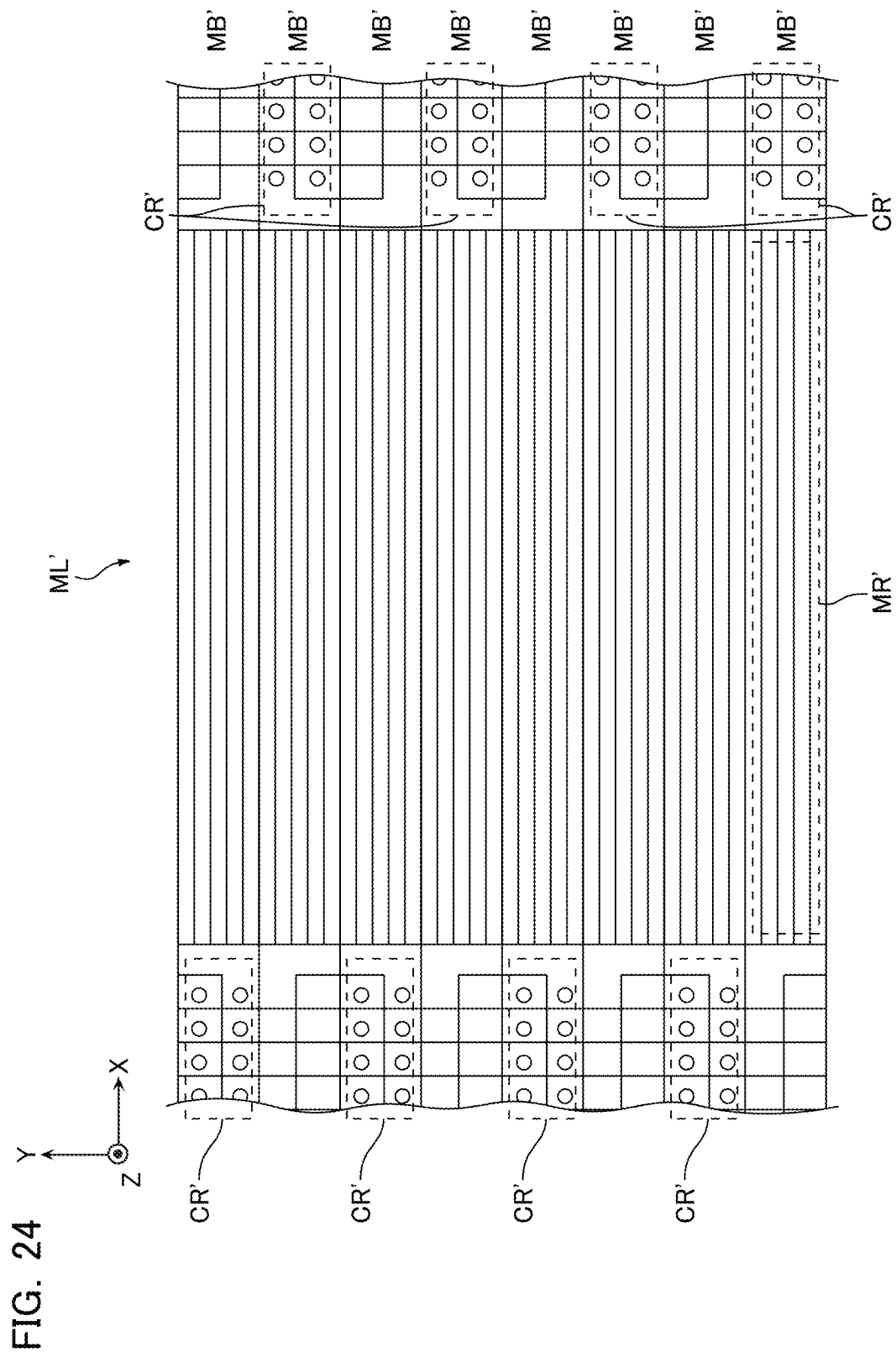
FIG. 24 is a schematic plan view of a semiconductor memory device according to a first comparative example.

Next, with reference to FIG. 24, a semiconductor memory device according to the first comparative example will be described. FIG. 24 is a schematic plan view for describing the semiconductor memory device according to the first comparative example.

A memory block MB" according to the first comparative example includes a memory region MR" extending in the X-direction and a contact region CR" disposed on one end portion in the X-direction of the memory region MR".

In the memory block MB" according to the first comparative example, since a contact region CR" is disposed on one end portion in the X-direction of the memory region MR", a distance from the contact region CR" to the other end portion in the X-direction of the memory region MR" increases, and there may be a case where transfer of a voltage to the conducting layer 110 takes time.

[Second Comparative Example]

Figure 25:
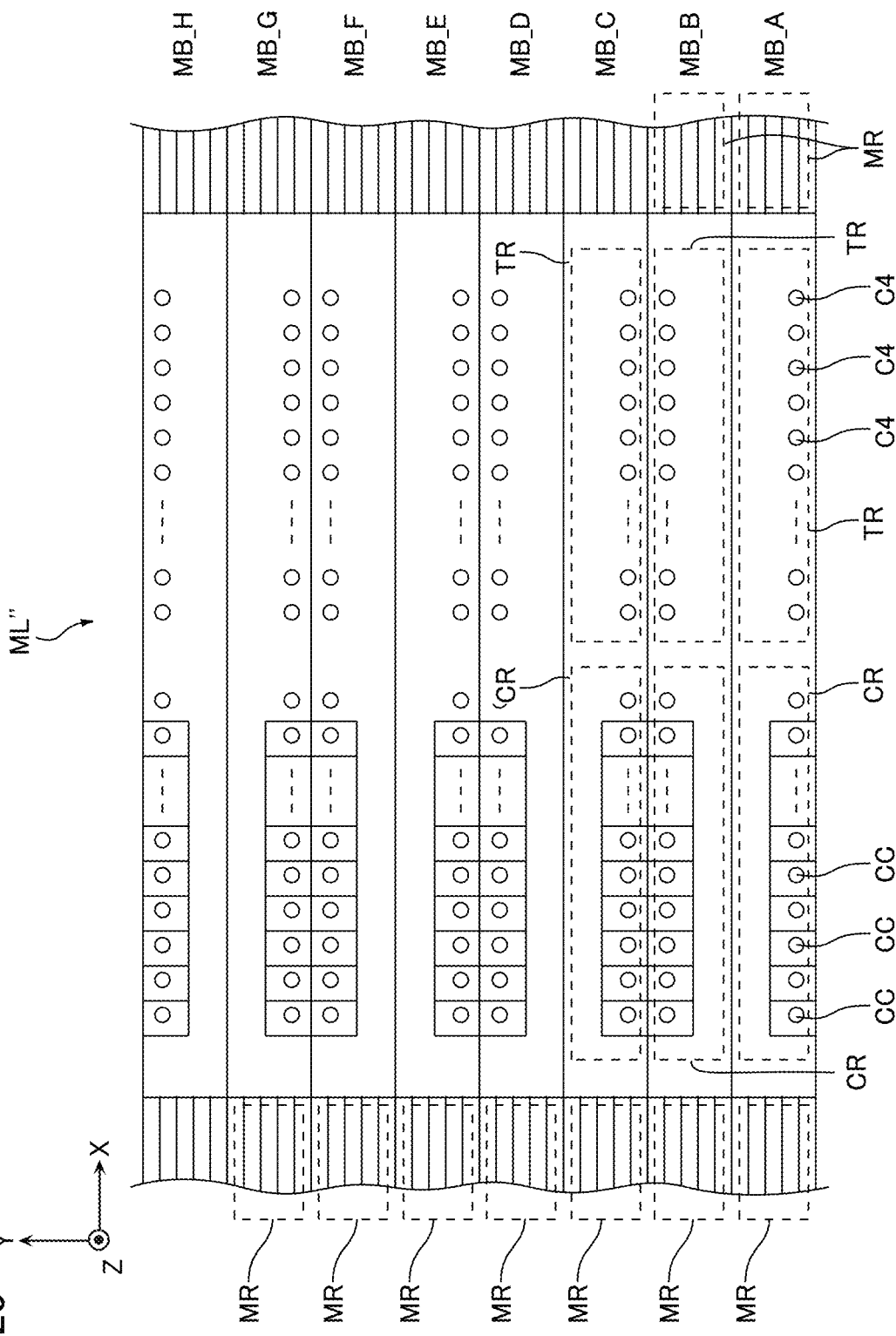
FIG. 25 is a is a schematic plan view of a semiconductor memory device according to a second comparative example.
Figure 26:
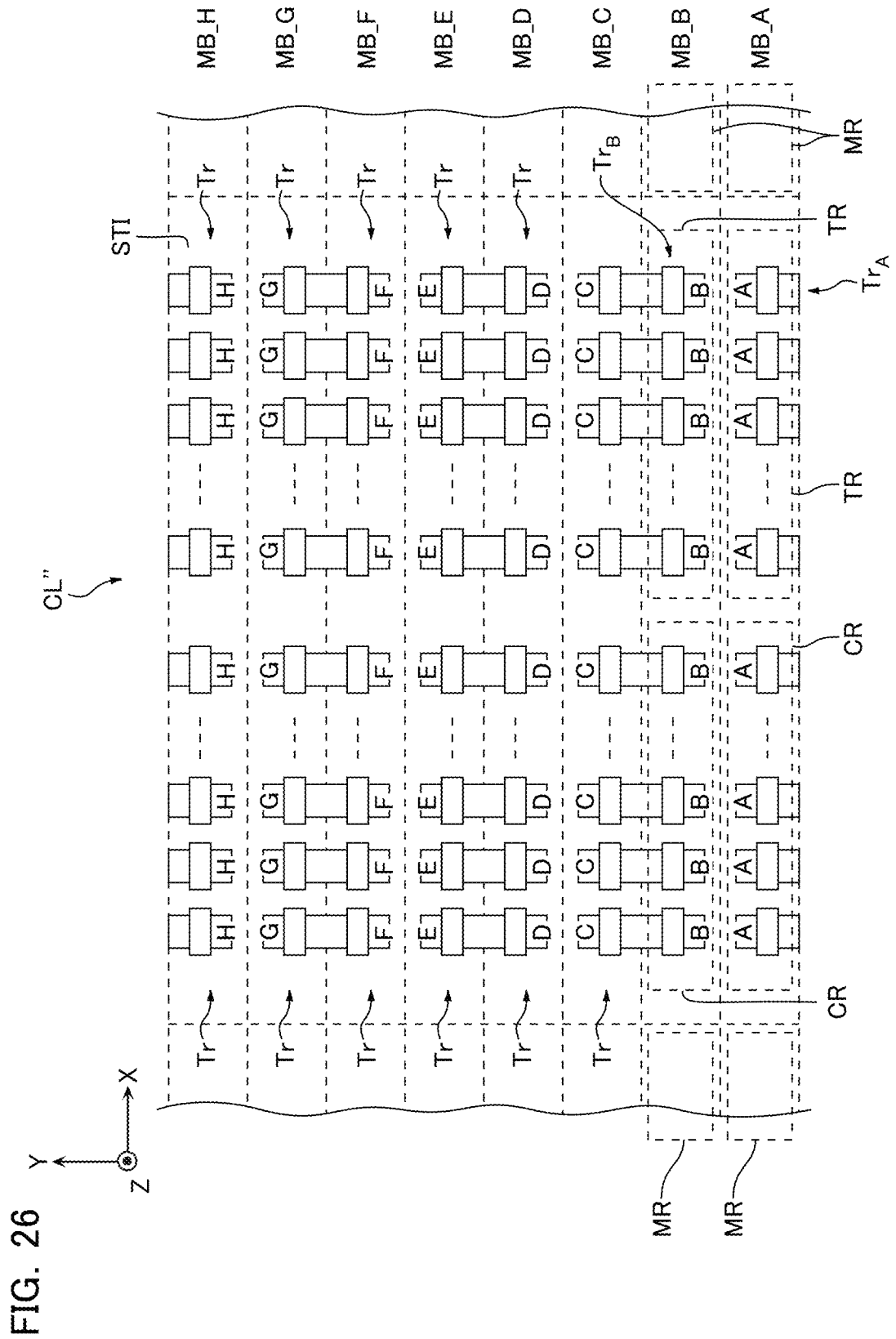
FIG. 26 is a schematic plan view of the semiconductor memory device.

Next, with reference to FIG. 25 and FIG. 26, a semiconductor memory device according to the second comparative example will be described. FIG. 25 and FIG. 26 are schematic plan views for describing the semiconductor memory device according to the second comparative example.

As illustrated in FIG. 25, in a memory layer ML" according to the second comparative example, the memory blocks MB each include the two memory regions MR extending in the X-direction and arranged in the X-direction, the contact region CR disposed between these two memory regions MR, and the through contact region TR disposed between the contact region CR and the memory region MR. Additionally, in the second comparative example, the contact regions CR and the through contact regions TR are not disposed in the staggered pattern. That is, in the second comparative example, all of the contact regions CR are arranged in the Y-direction and all of the through contact regions TR are arranged in the Y-direction.

As illustrated in FIG. 26, a circuit layer CL" according to the second comparative example includes the plurality of transistors Tr arranged in a matrix in the X-direction and the Y-direction. Moreover, in the second comparative example, the plurality of transistors Tr connected to the conducting layers 110 in each memory block MB are arranged in a row in the X-direction. Additionally, the two transistors Tr (for example, transistors $Tr_A$, $Tr_B$ in the drawing) adjacent in the Y-direction via the insulating layer STI are connected to the conducting layers 110 in the different memory blocks MB.

As illustrated in FIG. 25, the semiconductor memory device according to the second comparative example includes the contact region CR between the two memory regions MR arranged in the X-direction. Therefore, assume that the numbers of the memory cells MC included in the memory block MB' of the first comparative example and included in the memory block MB of the second comparative example are the same, a length in the X-direction of the memory region MR of the second comparative example becomes half of a length in the X-direction of the memory region MR' of the first comparative example. Therefore, compared with the memory block MB' of the first comparative example, the memory block MB allows high speed voltage transfer to the conducting layers 110.

Here, for example, when the write operation is performed on the memory cell MC in the memory block MB_A, a program voltage around 20 V is supplied to the conducting layer 110 connected to the selected memory cell MC in the memory block MB_A, and a write pass voltage around 10 V is supplied to the conducting layers 110 other than that in the memory block MB_A. Moreover, the conducting layers 110 in the other memory blocks MB enter the floating state at a voltage around 0 V. In this case, for example, a program voltage around 20 V is supplied to a drain region of the transistor $Tr_A$ in FIG. 26, and a drain region of the transistor $Tr_B$ enters the floating state around 0 V. In this case, a voltage difference of 20 V occurs in the insulating layers STI between them, and this possibly causes dielectric breakdown of the insulating layer STI. To reduce this, although a distance between the drain regions of the transistors Tr need to be increased, this possibly causes an increase in circuit area.

In the example of FIG. 26, among the transistors Tr connected to the conducting layers 110 in the memory block MB_A, the right half of the transistors Tr are disposed at positions corresponding to the through contact region TR and therefore can be comparatively easily connected to the through contacts C4. However, since the left half of the transistors Tr are not disposed at the positions corresponding to the through contacts C4, a plurality of wirings extending in the X-direction are required, and this possibly results in a complicated wiring pattern in the circuit layer CL".

Additionally, in the example of FIG. 25, all of the contact regions CR are arranged in the Y-direction and all of the through contact regions TR are arranged in the Y-direction. Accordingly, to connect the contacts CC in the contact region CR with the through contacts C4 in the through contact region TR, a plurality of wirings extending in the X-direction are required, and this possibly results in a complicated wiring pattern in the memory layer ML".

Figure 27:
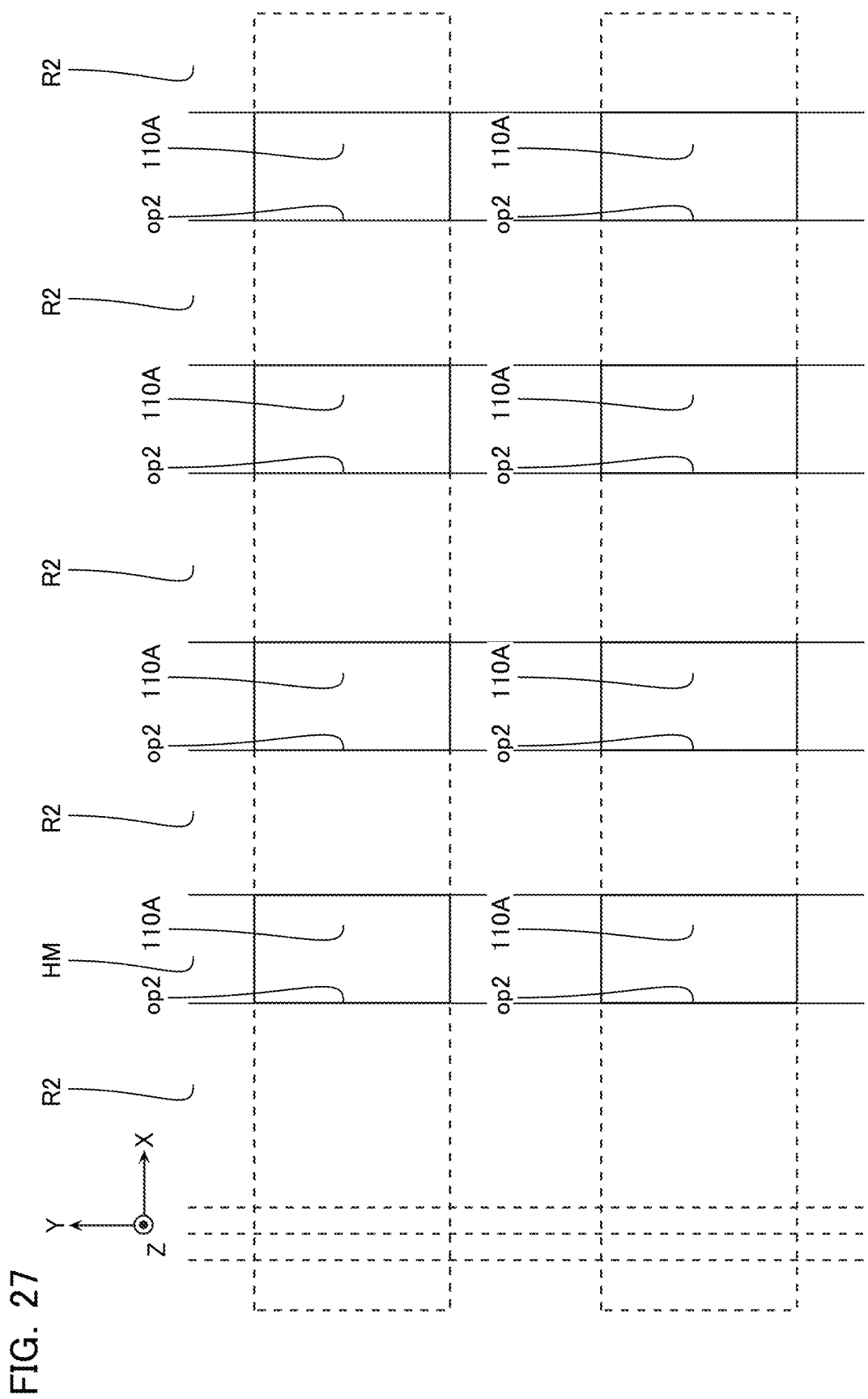
FIG. 27 is a schematic view illustrating the method for manufacturing the semiconductor memory device.

Additionally, for example, as described with reference to FIG. 16, in the process of forming the contact region CR, the opening extending in the X-direction is formed in the hard masks HM. Here, in the example of FIG. 25, all of the contact regions CR are arranged in the Y-direction. To form the structure, for example, as exemplified in FIG. 27, the openings in the hard masks HM need to be formed in a density higher than that of the first embodiment corresponding to all of the contact regions CR in the memory blocks MB. In this case, for example, in a resist for processing to form the openings in the hard masks HM, openings of the resist corresponding to the openings op2 arranged the Y-direction are mutually connected and a pattern collapse of the resist or the like possibly occurs. The similar problem possibly occurs also in the openings op3 in the resist R3 described with reference to FIG. 20 and the like and the openings op4 in the resist R4 described with reference to FIG. 22 and the like.

[Effects of Semiconductor Memory Device According to First Embodiment]

In the semiconductor memory device according to the first embodiment, for example, as described with reference to FIG. 10 and the like, the plurality of transistors Tr adjacent in the X-direction or the Y-direction via the insulating layers STI correspond to the same memory block MB. In the configuration, when the program voltage around 20 V is supplied to any of the transistors Tr in the write operation, the write pass voltage around 10 V is supplied to the plurality of transistors Tr adjacent to this transistor via the insulating layers STI. Therefore, a voltage difference generated in the insulating layers STI can be significantly reduced. Accordingly, the dielectric breakdown of the insulating layer STI as described above can be reduced without an increase in circuit area.

Additionally, in the first embodiment, the contact regions CR and the through contact regions TR are disposed in the staggered pattern. With the configuration, the through contact regions TR can be disposed corresponding to the plurality of transistors Tr corresponding to the respective memory blocks MB. This allows shortening the distance between the through contacts C4 and the transistors Tr and reducing the complicated wiring pattern in the circuit layer CL. With the configuration, the corresponding contact regions CR and through contact regions TR can be disposed to be arranged in the Y-direction. This allows shortening the distance between the contacts CC and the through contacts C4 and reducing the complicated wiring pattern in the memory layer ML.

In the manufacturing process of the semiconductor memory device according to the first embodiment, for example, as illustrated in FIG. 16, the distance between the openings op2 in the Y-direction can be easily ensured. This allows reducing, for example, pattern collapse of, for example, a resist for processing the hard masks HM.

[Drain Selection Line SGD]

Next, a relationship between the conducting layer 110 that functions as the drain select line SGD and the transistor in the circuit layer CL will be described.

As described above, a part of the plurality of conducting layers 110 functions as the word line WL or the source select line SGS. Additionally, a part of the plurality of conducting layers 110 functions as the drain select line SGD. As described with reference to FIG. 5 and the like, the conducting layer 110 that functions as the word line WL or the like includes the part included in the two memory regions MR arranged in the X-direction and apart connecting these memory regions MR (the wiring regions wla, wlc in FIG. 7). Meanwhile, the conducting layer 110 that functions as the drain select line SGD only includes the part included in the two memory regions MR arranged in the X-direction and does not include the part connecting these memory regions MR. These conducting layers 110 may be controlled by different transistors or may be electrically connected with, for example, a wiring.

Figure 28:
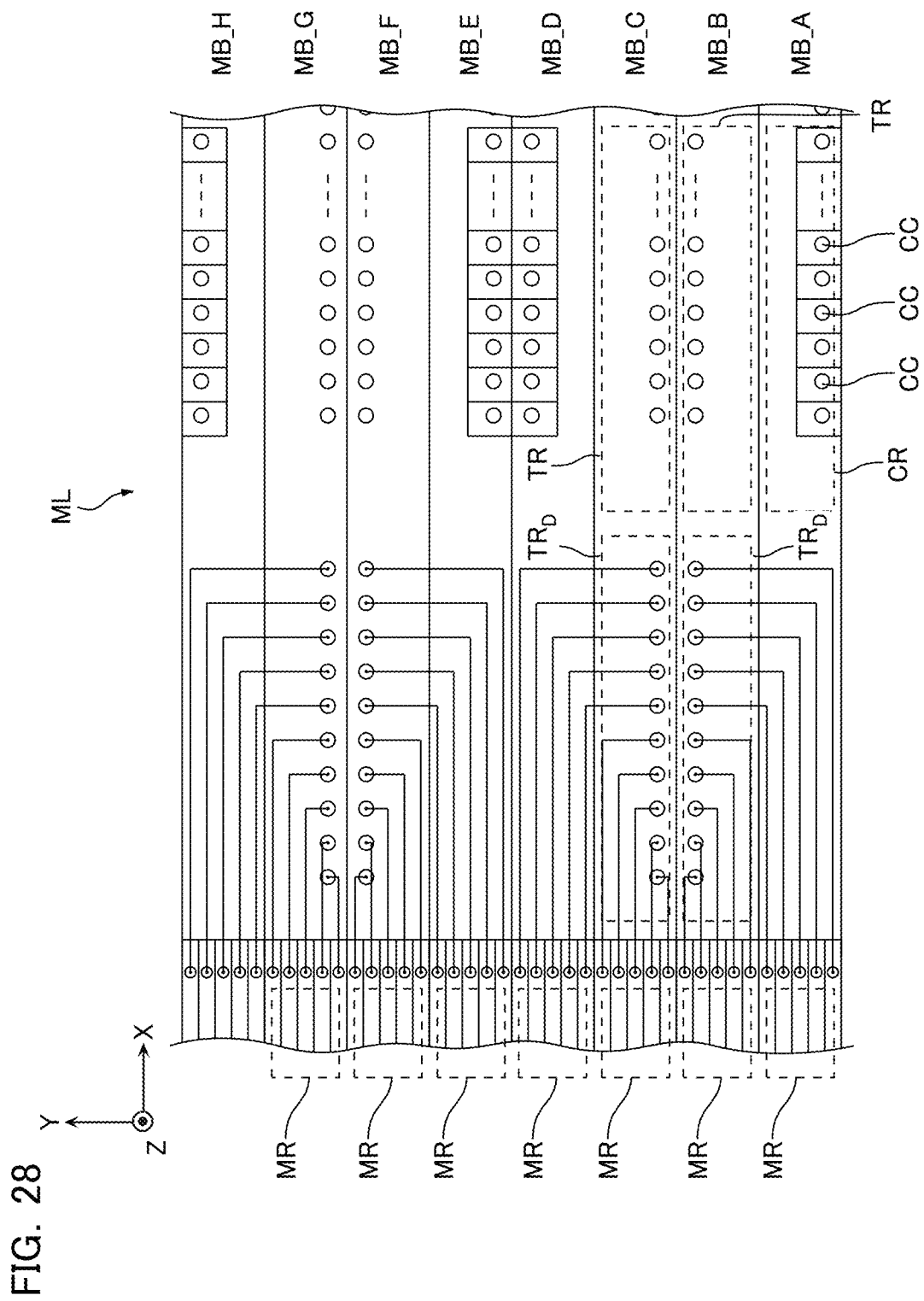
FIG. 28 is a schematic plan view illustrating an exemplary configuration of the semiconductor memory device according to the first embodiment.

For example, in the example of FIG. 28, a through contact region $TR_D$ is disposed between the memory region MR and the through contact region TR. The through contact region $TR_D$ includes the configuration similar to that of the above-described through contact region TR. The conducting layer 110 that functions as the drain select line SGD is connected to the transistor in the circuit layer CL via the through contact C4 in the through contact region $TR_D$.

Additionally, in the example of FIG. 28, the drain select line SGD disposed on one side in the X-direction (for example, the right side in FIG. 5) and the drain select line SGD disposed on the other side in the X-direction (for example, the left side in FIG. 5) are driven by the different transistors. For example, in the circuit layer CL, the plurality of transistors are disposed in the region between the transistor array TA1 and the memory region MR on the other side in the X-direction, and the plurality of transistors function as the block driving transistors 35 corresponding to the drain select line SGD. In the circuit layer CL, the plurality of transistors are disposed in the region between the transistor array TA2 and the memory region MR on one side in the X-direction, and the plurality of transistors function as the block driving transistors 35 corresponding to the drain select line SGD.

Figure 29:
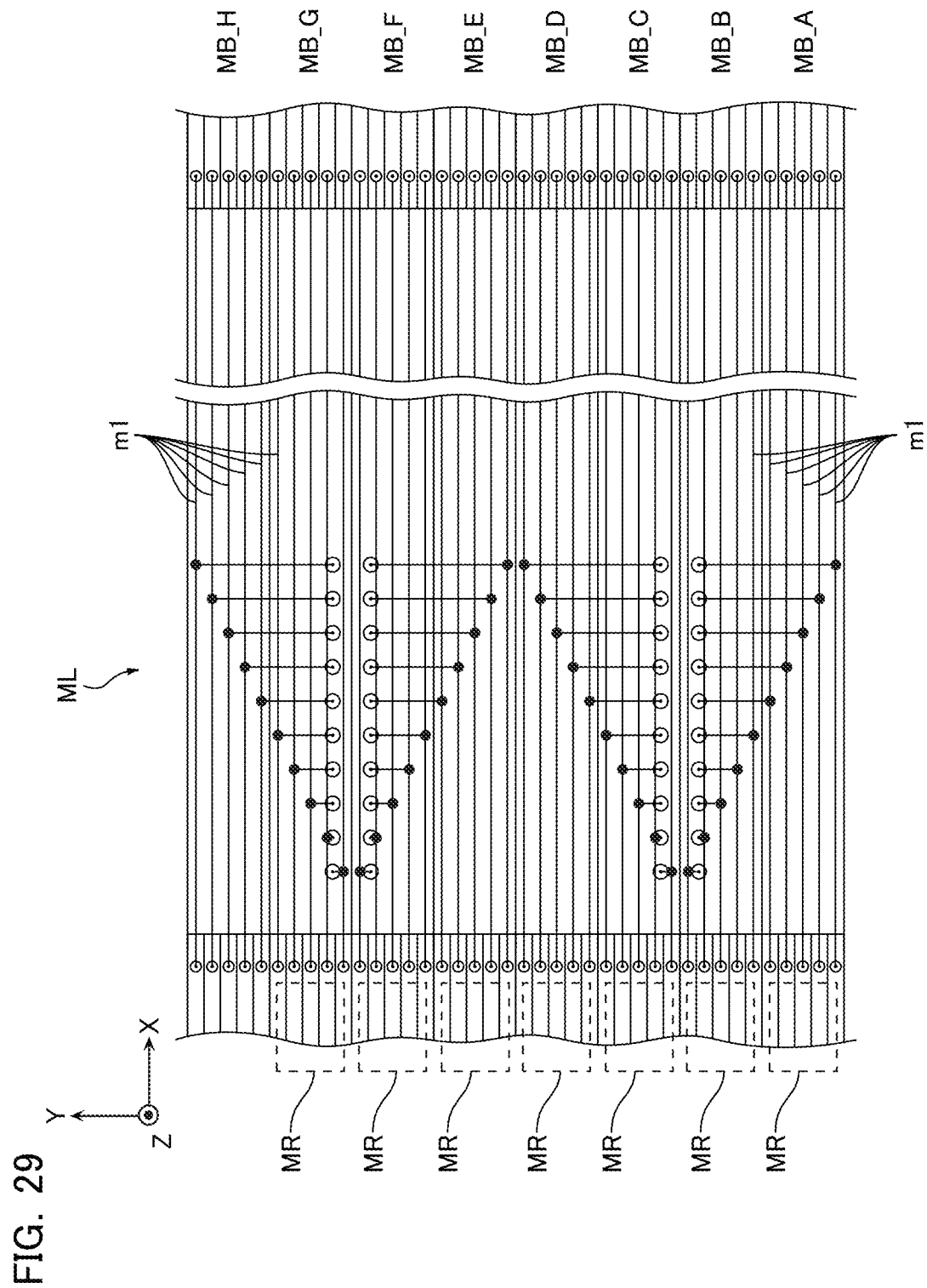
FIG. 29 is a schematic plan view illustrating the exemplary configuration of the semiconductor memory device according to the first embodiment.

Additionally, in the example of FIG. 29, the drain select line SGD disposed on one side in the X-direction and the drain select line SGD disposed on the other side in the X-direction are driven by the same transistor. For example, the drain select line SGD disposed on one side in the X-direction and the drain select line SGD disposed on the other side in the X-direction are connected via, for example, a wiring m1 on a layer upper than the wiring m0. Additionally, in the circuit layer CL, the plurality of transistors are disposed in the region between the transistor array TA1 or the transistor array TA2 and the memory region MR, or the region between the transistor array TA1 and the transistor array TA2. The plurality of transistors function as the block driving transistors 35 corresponding to the drain select line SGD.

Second Embodiment

Next, with reference to FIG. 30 and FIG. 31, a configuration of a semiconductor memory device according to the second embodiment will be described. The following drawings are schematic, and for convenience of description, a part of configurations is sometimes omitted. In the following description, same reference numerals are given to parts similar to those of the first embodiment to omit the description.

In the first embodiment, for example, as illustrated in FIG. 2, the bit lines BL are farther from the semiconductor substrate S than the conducting layers 110, the semiconductor columns 120, and the gate insulating films 130, and the conducting layer 140 is closer to the semiconductor substrate S than the conducting layers 110, the semiconductor columns 120, and the gate insulating films 130. The upper ends of the semiconductor columns 120 are connected to the bit lines BL, the lower ends of the semiconductor columns 120 are connected to the conducting layer 140, and the lower ends of the contacts CC are connected to the conducting layers 110. The upper ends of the plurality of contacts CC are disposed above the plurality of conducting layers 110.

Figure 30:
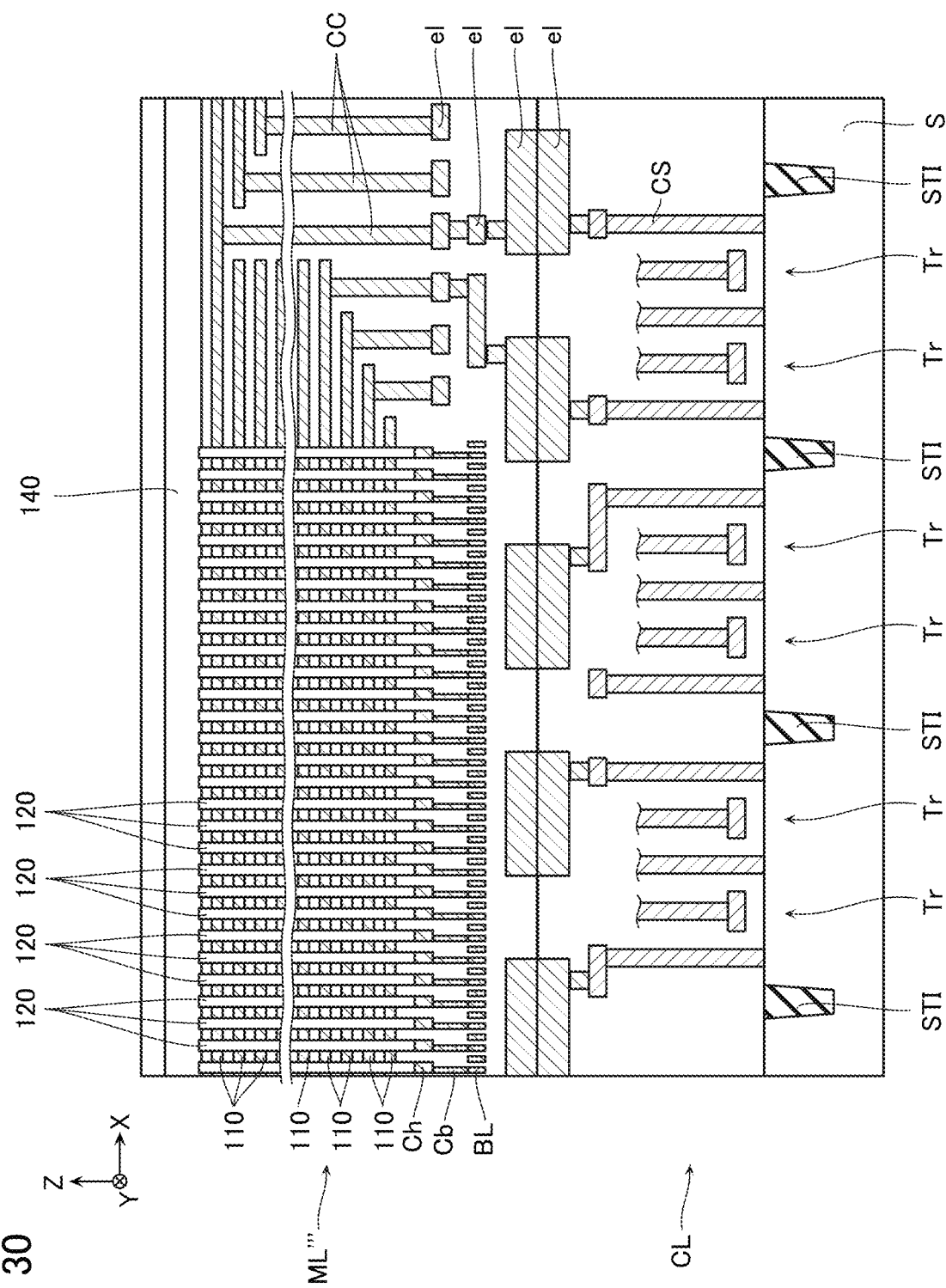
FIG. 30 is a schematic cross-sectional view illustrating a configuration of a semiconductor memory device according to a second embodiment.

Meanwhile, in the second embodiment, for example, as illustrated in FIG. 30, the bit lines BL are closer to the semiconductor substrate S than the conducting layers 110, the semiconductor columns 120, and gate insulating films (not illustrated), and the conducting layer 140 is farther from the semiconductor substrate S than the conducting layers 110, the semiconductor columns 120, and the gate insulating films (not illustrated). The lower ends of the semiconductor columns 120 are connected to the bit lines BL, the upper ends of the semiconductor columns 120 are connected to the conducting layer 140, and the upper ends of the contacts CC are connected to the conducting layers 110. Additionally, the lower ends of the plurality of contacts CC are disposed downward of the plurality of conducting layers 110.

Such a configuration is, for example, manufacturable by, forming the circuit layer CL on the semiconductor substrate S, forming a memory layer ML''' on a different substrate (not illustrated), and laminating this memory layer ML''' to the circuit layer CL.

Figure 31:
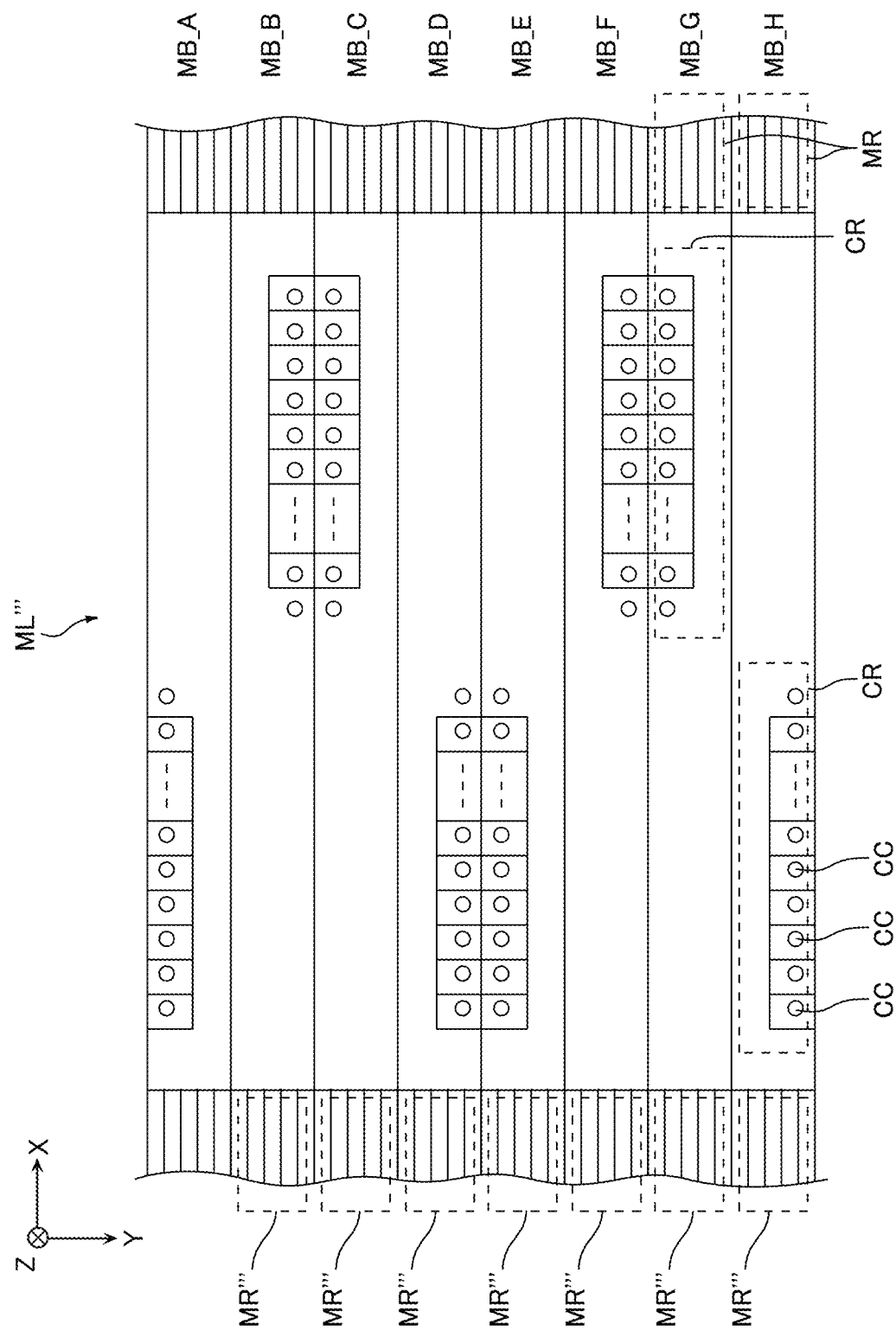
FIG. 31 is a schematic plan view of the semiconductor memory device.

FIG. 31 is a schematic bottom view of the memory regions MR''' according to the second embodiment. As illustrated in FIG. 31, in the memory region MR''' according to the second embodiment, the contact region CR is disposed with the arrangement similar to that of the first embodiment, and the contacts CC are disposed in each contact region CR by the arrangement similar to that of the first embodiment. Meanwhile, the memory region MR''' according to the second embodiment does not include the through contact region TR or the through contact C4. The plurality of conducting layers 110 in the memory layer ML''' are connected to the transistors Tr in the circuit layer CL via the contacts CC, the contacts CS (FIG. 30), and a plurality of electrodes el (FIG. 30) disposed between the contacts CC and the contacts CS. Note that the arrangement and the like of the transistors Tr in the circuit layer CL are similar to those of the first embodiment (see FIG. 10).

Such a configuration also allows providing the effects similar to those of the first embodiment.

Other Embodiments

In the first embodiment and the second embodiment, in the transistor arrays TA1, TA2, the arrangement cycle of the plurality of transistors Tr in the Y-direction matches the arrangement cycle of the plurality of memory blocks MB in the Y-direction. Additionally, the two transistors Tr arranged in the Y-direction across the region including two memory blocks MB correspond to one memory block MB. The contacts CC are periodically arranged in the Y-direction corresponding to the four memory blocks MB arranged in the Y-direction. In the circuit layer CL, the two transistors arrays TA1, TA2 arranged in the X-direction are disposed.

However, such a configuration is merely an example, and the specific configurations are appropriately adjustable.

Figure 32:
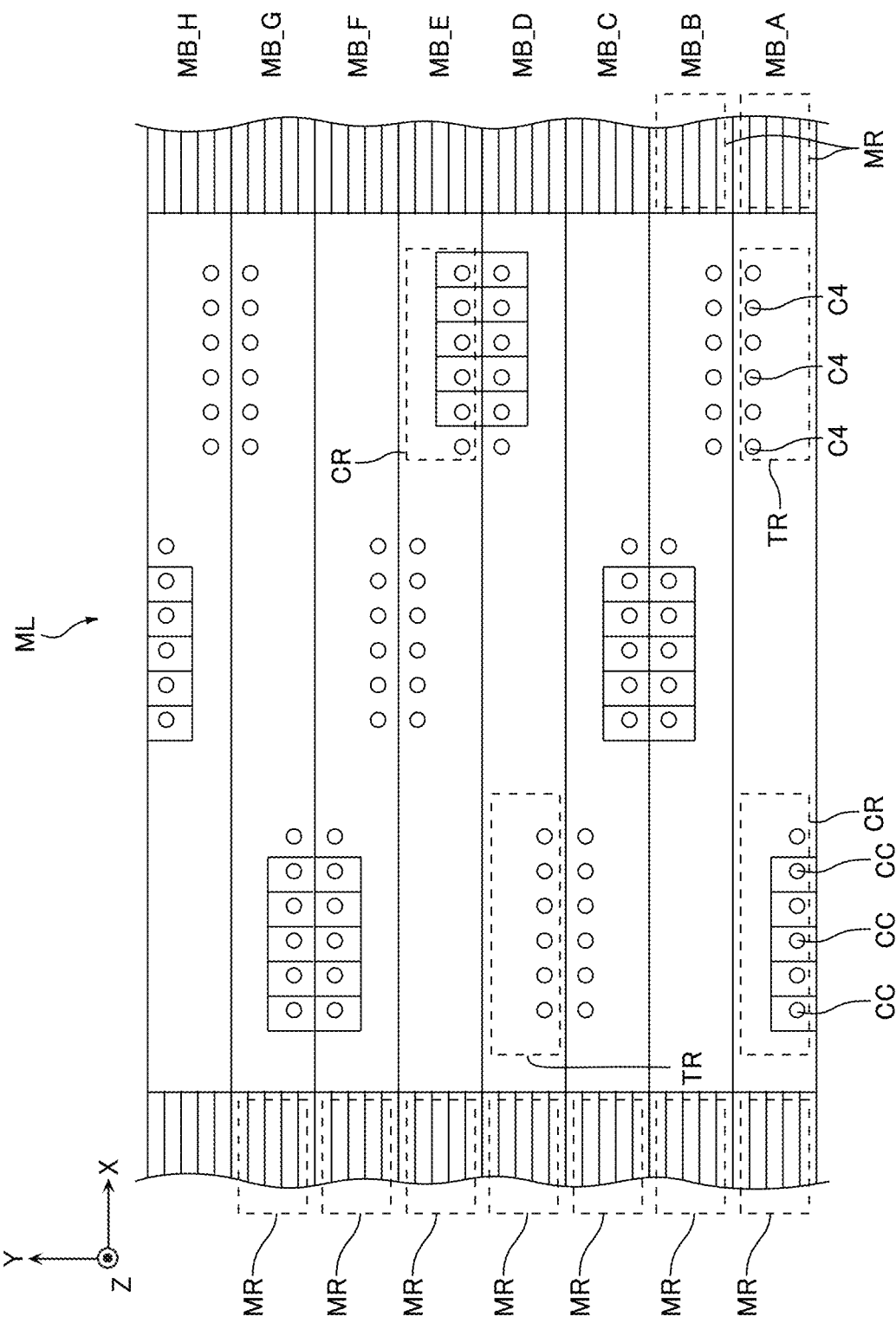
FIG. 32 is a schematic view of a semiconductor memory device according to another embodiment.
Figure 33:
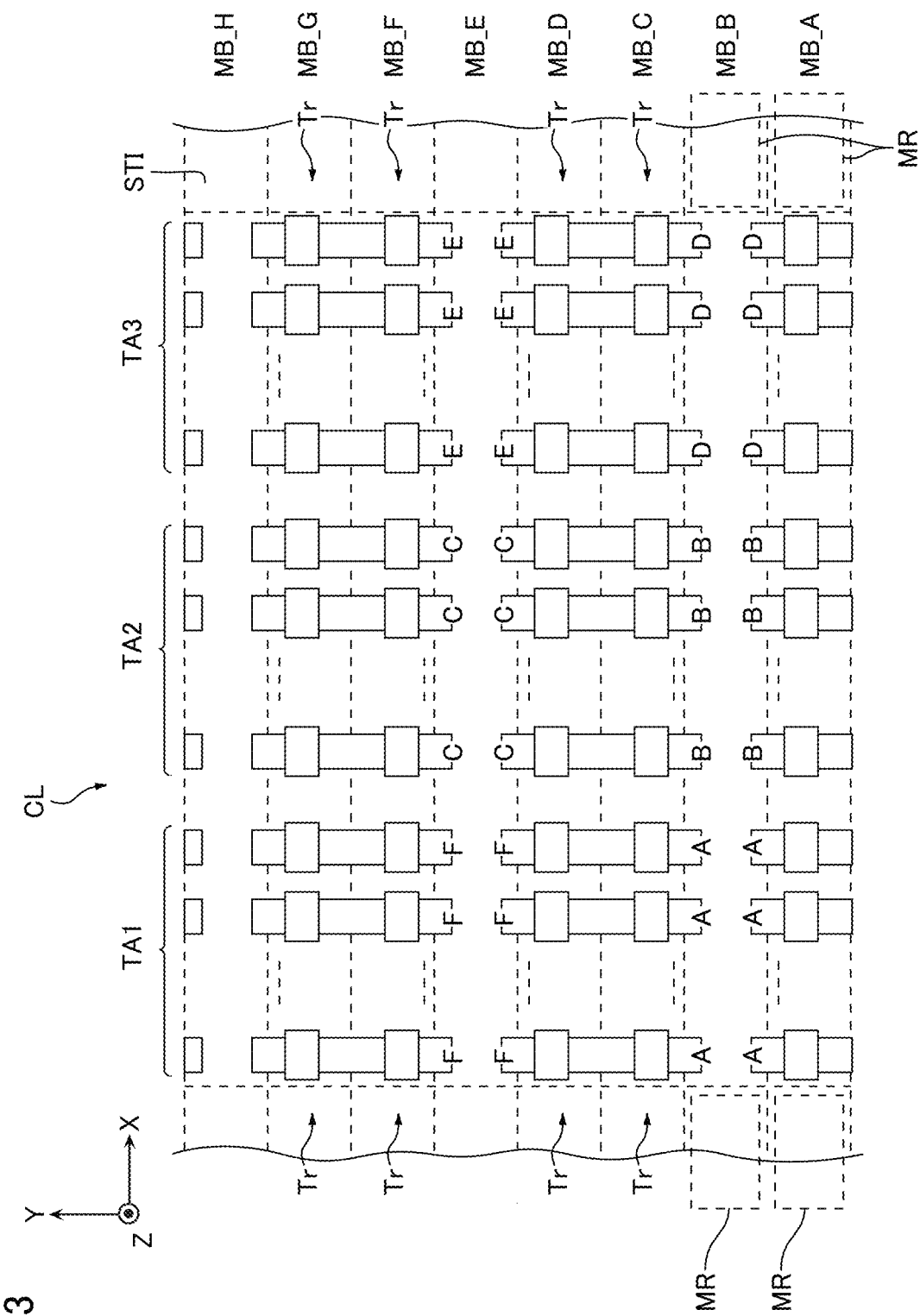
FIG. 33 is a schematic view of a semiconductor memory device according to the other embodiment.

For example, in the example of FIG. 32 and FIG. 33, 1.5 pieces of the memory blocks MB are arranged in the Y-direction per transistor Tr. Additionally, the two transistors Tr arranged in the Y-direction across the region including three memory blocks correspond to one memory block MB. The contacts CC are periodically arranged in the Y-direction corresponding to the six memory blocks MB arranged in the Y-direction. The circuit layer CL includes three transistor arrays TA1, TA2, TA3 arranged in the X-direction. Such a configuration also allows simplifying the wiring pattern in the circuit layer CL.

Figure 34:
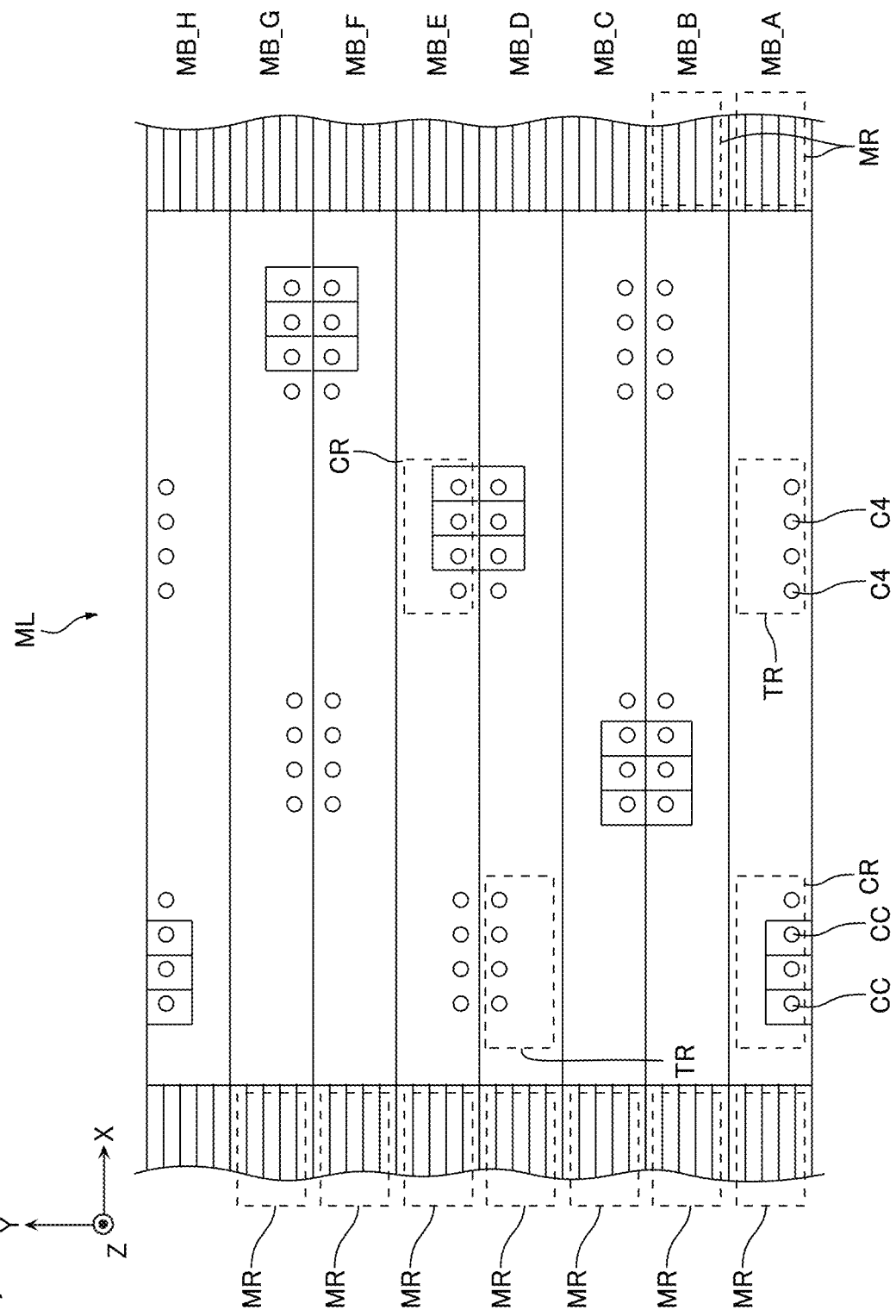
FIG. 34 is a schematic view of a semiconductor memory device according to another embodiment.
Figure 35:
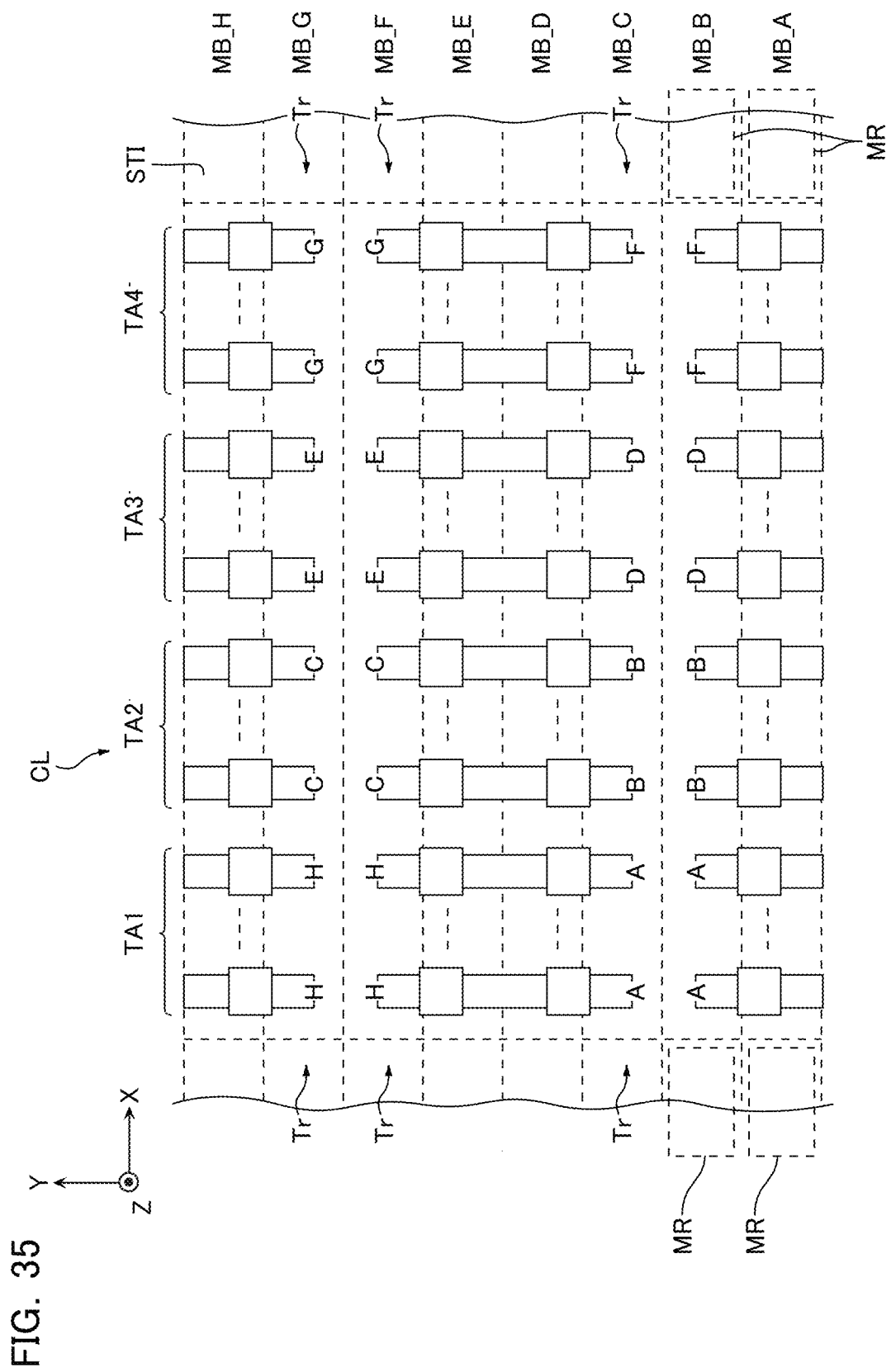
FIG. 35 is a schematic view of a semiconductor memory device according to the other embodiment.

For example, in the example of FIG. 34 and FIG. 35, the two memory blocks MB are arranged in the Y-direction per transistor Tr. Additionally, the two transistors Tr arranged in the Y-direction across the region including four memory blocks correspond to one memory block MB. The contacts CC are periodically arranged in the Y-direction corresponding to the eight memory blocks MB arranged in the Y-direction. Four transistor arrays TA1, TA2, TA3, TA4 arranged in the X-direction are disposed in the circuit layer CL. Such a configuration also allows simplifying the wiring pattern in the circuit layer CL.

In the first embodiment, the contact region CR and the through contact region TR have the similar areas, one through contact region TR is disposed corresponding to one contact region CR, and these regions are arranged in the Y-direction. However, for example, the area of the contact region CR may be different from the area of the through contact region TR. In this case, for example, the two or more through contact regions TR may be disposed corresponding to each contact region CR, and these regions may be arranged in the Y-direction.

Figure 36:
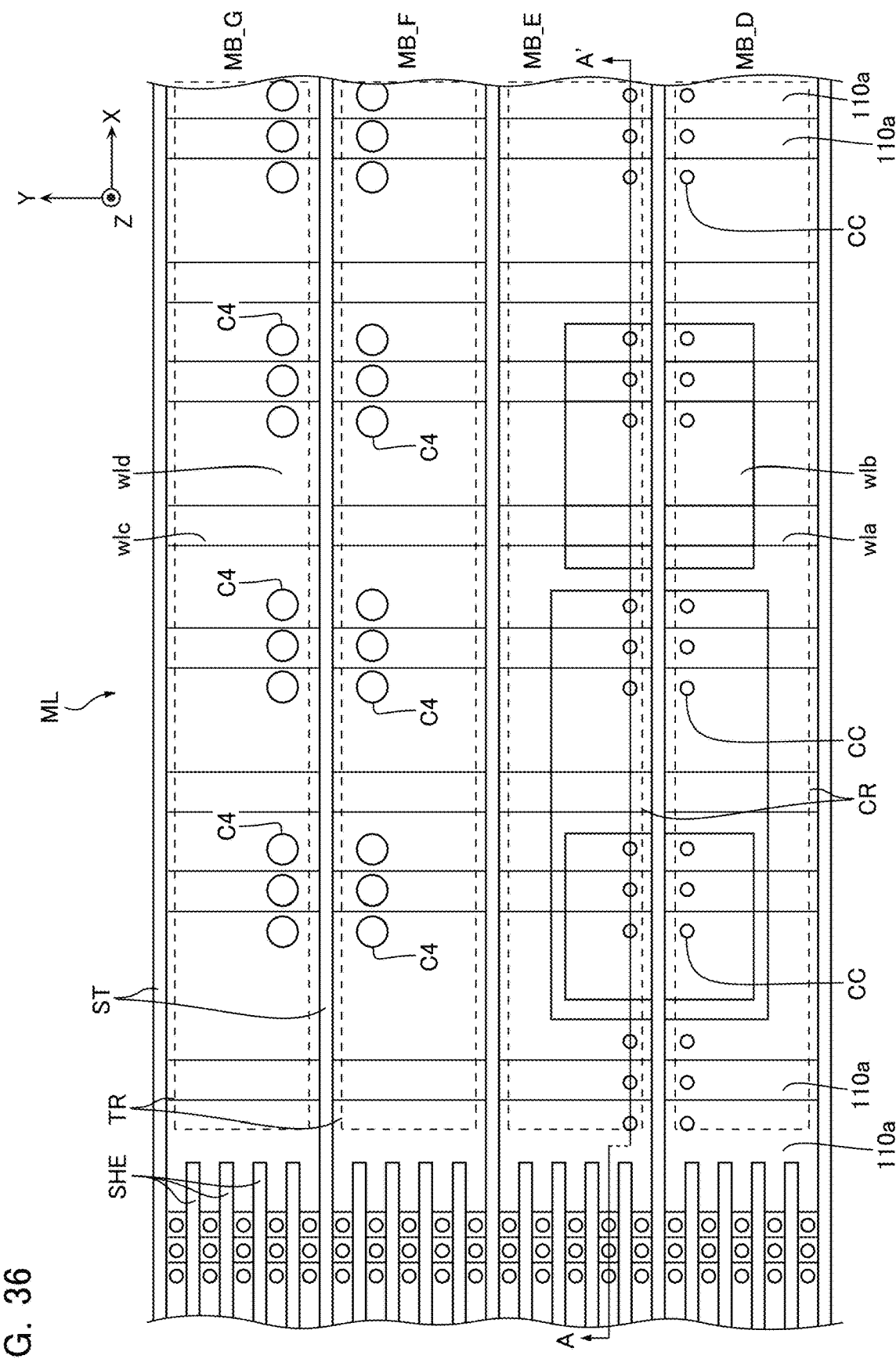
FIG. 36 is a schematic view of a semiconductor memory device according to another embodiment.
Figure 37:
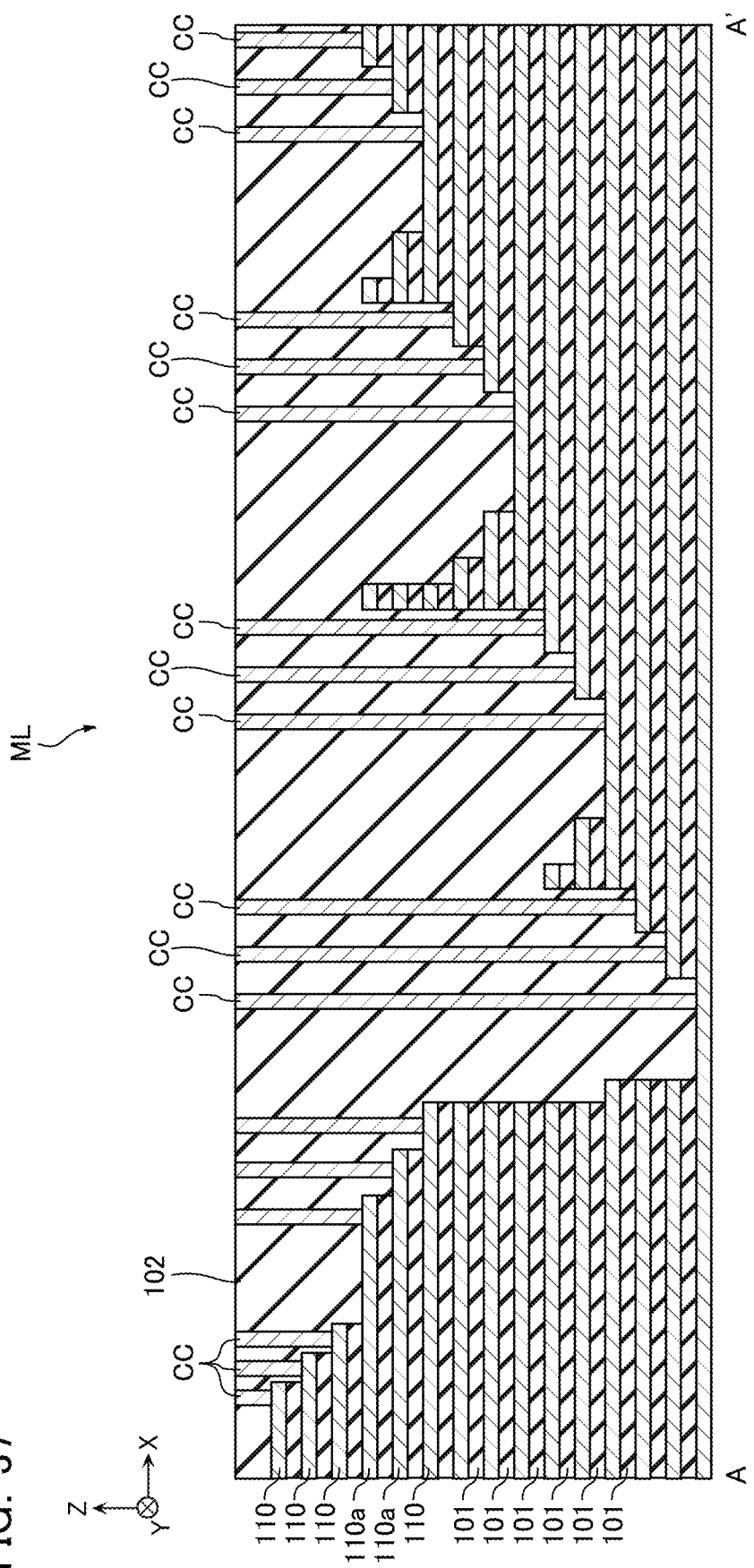
FIG. 37 is a schematic view of a semiconductor memory device according to the other embodiment.

Additionally, in the first embodiment, among the plurality of conducting layers 110, all the conducting layers 110 that function as the word lines WL include the parts (see FIG. 5) included in the two memory regions MR arranged in the X-direction and the parts (the wiring regions wla, wlc in FIG. 7) connecting these memory regions MR. However, such a configuration merely an example, and the specific configurations are appropriately adjustable. For example, in the example of FIG. 36 and FIG. 37, a part of conducting layers 110a that function as the word lines WL are separated in the X-direction in the contact region CR. Each part of the conducting layers 110a thus separated in the X-direction may be connected by, for example, a wiring, and may be controlled by the common transistor.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a semiconductor substrate;
a memory cell array disposed separately from the semiconductor substrate in a first direction intersecting with a surface of the semiconductor substrate; and
a transistor array including a plurality of transistors disposed on the semiconductor substrate,
wherein the memory cell array includes a first region to a fourth region arranged in order in a second direction intersecting with the first direction and a fifth region to an eighth region arranged in order in the second direction,
wherein in a third direction intersecting with the first direction and the second direction:
the fifth region is adjacent to the first region;
the sixth region is adjacent to the second region;
the seventh region is adjacent to the third region; and
the eighth region is adjacent to the fourth region,
wherein the memory cell array includes:
a plurality of first conducting layers extending in the second direction in the first region to the fourth region and laminated in the first direction;
a plurality of first semiconductor columns extending in the first direction to be opposed to the first conducting layers to thereby form a plurality of first memory cells at the first region;
a plurality of first connection contacts extending in the first direction to be connected to the respective first conducting layers at the second region;
a plurality of second semiconductor columns extending in the first direction to be opposed to the first conducting layers to thereby form a plurality of second memory cells at the fourth region;
a plurality of second conducting layers extending in the second direction in the fifth region to the eighth region and laminated in the first direction;
a plurality of third semiconductor columns extending in the first direction to be opposed to the second conducting layers to thereby form a plurality of third memory cells at the fifth region;
a plurality of second connection contacts extending in the first direction to be connected to the respective second conducting layers at the seventh region; and
a plurality of fourth semiconductor columns extending in the first direction to be opposed to the second conducting layers to thereby form a plurality of fourth memory cells at the eighth region,
wherein a part of the transistors of the transistor array are connected to the respective first conducting layers via the respective first connection contacts, and wherein an another part of the transistors of the transistor array are connected to the respective second conducting layers via the respective second connection contacts.

2. The semiconductor memory device according to claim 1, wherein
the part of the transistors includes
a plurality of first transistors disposed on the semiconductor substrate to be overlapped with the second region, and
a plurality of second transistors disposed on the semiconductor substrate to be overlapped with the sixth region, and
the another part of the transistors includes
a plurality of third transistors disposed on the semiconductor substrate to be overlapped with the third region, and
a plurality of fourth transistors disposed on the semiconductor substrate to be overlapped with the seventh region.

3. The semiconductor memory device according to claim 2, wherein
the first transistors are arranged in the second direction, and each of the first transistors has a source region, a drain region and a gate electrode arranged therebetween in the third direction,
the second transistors are arranged in the second direction, and each of the second transistors has a source region, a drain region and a gate electrode arranged therebetween in the third direction,
the third transistors are arranged in the second direction, and each of the third transistors has a source region, a drain region and a gate electrode arranged therebetween in the third direction,
the fourth transistors are arranged in the second direction, and each of the fourth transistors has a source region, a drain region and a gate electrode arranged therebetween in the third direction,
a part of the first connection contacts are each connected to one the source region and the drain region of a corresponding one of the first transistors,
an another part of the first connection contacts are each connected to one the source region and the drain region of a corresponding one of the second transistors, the ones the source regions and the drain regions of the respective first transistors face the ones the source regions and the drain regions of the respective second transistors face in the third direction,
a part of the second connection contacts are each connected to one the source region and the drain region of a corresponding one of the third transistors, and
an another part of the second connection contacts are each connected to one the source region and the drain region of a corresponding one of the fourth transistors, the ones the source regions and the drain regions of the respective third transistors face the ones the source regions and the drain regions of the respective fourth transistors face in the third direction.

4. The semiconductor memory device according to claim 3, wherein
when a distance between the first transistors in the second direction or a distance between the second transistors in the second direction is defined as a first distance,
when a distance between the first transistors and the second transistors in the third direction is defined as a second distance, and when a distance between the first transistor array and the second transistor array in the second direction is defined as a third distance:
the third distance is larger than the first distance; and
the third distance is larger than the second distance.

5. The semiconductor memory device according to claim 4, wherein
the transistor array further includes:
a plurality of fifth transistors arranged in the second direction and including a region in common with the first transistors, respectively;
a plurality of sixth transistors arranged in the second direction and including a region in common with the second transistors, respectively;
a plurality of seventh transistors arranged in the second direction and including a region in common with the third transistors, respectively; and
a plurality of eighth transistors arranged in the second direction and including a region in common with the fourth transistors, respectively.

6. The semiconductor memory device according to claim 2, wherein
the memory cell array further includes
a plurality of first through contacts extending in the first direction at the third region, and
a plurality of second through contacts extending in the first direction at the sixth region, and
wherein the first transistors and the second transistors are connected to the first conducting layers via the second through contacts and the first connection contacts, and the third transistors and the fourth transistors are connected to the second conducting layers via the first through contacts and the second connection contacts.

7. The semiconductor memory device according to claim 5, comprising:
a plurality of first wirings extending in the third direction in the second region and the sixth region and arranged in the second direction; and
a plurality of second wirings extending in the third direction in the third region and the seventh region and arranged in the second direction, wherein
the first wirings connect the first connection contacts and the second through contacts, respectively, and
the second wirings connect the second connection contacts and the first through contacts, respectively.

8. The semiconductor memory device according to claim 1, wherein
the memory cell array further includes
a plurality of first bit lines extending in the third direction in the second region and the sixth region and arranged in the second direction to be connected to one ends of the first semiconductor columns, respectively, and to be connected to one ends of the third semiconductor columns, respectively,
a plurality of second bit lines extending in the third direction in the third region and the seventh region and arranged in the second direction to be connected to one ends of the second semiconductor columns, respectively, and to be connected to one ends of the third semiconductor columns, respectively, and
a source line connected to the other ends of the first to fourth semiconductor columns.

9. The semiconductor memory device according to claim 8, wherein
the semiconductor substrate is closer to the source line rather than the first bit lines and the second bit lines.

10. The semiconductor memory device according to claim 8, wherein
the semiconductor substrate is closer to the first bit lines and the second bit lines rather than the source line.

11. The semiconductor memory device according to claim 10, further comprising:
a first chip including the semiconductor substrate and the transistor array; and
a second chip including the memory cell array and being bonded to the first chip.

12. The semiconductor memory device according to claim 1, wherein
the first conducting layers include:
a first part disposed in the first region, the first part extending in the second direction and being opposed to outer peripheral surfaces of the first semiconductor columns;
a second part disposed in the second region and extending in the second direction;
a third part disposed in the third region and extending in the second direction; and
a fourth part disposed in the fourth region, the fourth part extending in the second direction and being opposed to outer peripheral surfaces of the second semiconductor columns, wherein
the first part is connected to the fourth part via the second part and the third part, and
the second conducting layers include:
a fifth part disposed in the fifth region, the fifth part extending in the second direction and being opposed to outer peripheral surfaces of the third semiconductor columns;
a sixth part disposed in the sixth region and extending in the second direction;
a seventh part disposed in the seventh region and extending in the second direction; and
an eighth part disposed in the eighth region, the eighth part extending in the second direction and being opposed to outer peripheral surfaces of the fourth semiconductor columns, wherein
the fifth part is connected to the eighth part via the sixth part and the seventh part.

13. The semiconductor memory device according to claim 12, wherein
the second part in the first conducting layers is closer to the second conducting layers than the first connection contacts in the third direction, and
the seventh part in the second conducting layers is closer to the first conducting layers than the second connection contacts in the third direction.

14. The semiconductor memory device according to claim 1, wherein
the memory cell array includes:
a third conducting layer extending in the second direction in the first region, at one side of the first conducting layers in the first direction; and
a fourth conducting layer extending in the second direction in the fourth region, at the one side of the first conducting layers in the first direction.

15. The semiconductor memory device according to claim 13, wherein
the memory cell array further includes:
a ninth region disposed between the first region and the second region;
a tenth region disposed between the third region and the fourth region;
an eleventh region disposed between the fifth region and the sixth region; and
a twelfth region disposed between the seventh region and the eighth region,
the semiconductor memory device further includes:
a fifth transistor disposed in a region of the semiconductor substrate, the region including the ninth region and the eleventh region; and
a sixth transistor disposed in a region of the semiconductor substrate, the region including the tenth region and the twelfth region,
the third conducting layer is connected to the fifth transistor, and
the fourth conducting layer is connected to the sixth transistor.

16. The semiconductor memory device according to claim 13, further comprising:
a seventh transistor disposed on the semiconductor substrate; and
a third wiring extending in the second direction in the first region to the fourth region, the other side of the first conducting layers in the first direction,
wherein the third conducting layer and the fourth conducting layer are connected to the seventh transistor via the third wiring.

* * * * *